(12) United States Patent
Aram

(10) Patent No.: US 7,688,141 B1
(45) Date of Patent: *Mar. 30, 2010

(54) MULTI-AMPLIFIER CIRCUIT

(75) Inventor: Farbod Aram, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/286,772

(22) Filed: Oct. 2, 2008

Related U.S. Application Data

(60) Continuation of application No. 12/004,126, filed on Dec. 20, 2007, now Pat. No. 7,468,633, which is a division of application No. 11/504,348, filed on Aug. 15, 2006, now Pat. No. 7,312,659, which is a continuation-in-part of application No. 10/792,619, filed on Mar. 3, 2004, now Pat. No. 7,276,969.

(51) Int. Cl.
H03F 3/45 (2006.01)
(52) U.S. Cl. .................. 330/253; 330/260; 330/310
(58) Field of Classification Search ................ 330/103, 330/253, 260, 310
See application file for complete search history.

(56) References Cited

U.S. PATENT DOCUMENTS

| 5,220,686 | A | 6/1993 | Kasperkovitz et al. |
| 5,225,790 | A | 7/1993 | Noguchi et al. |
| 5,734,294 | A | 3/1998 | Bezzam et al. |
| 5,966,046 | A | 10/1999 | Bezzam et al. |
| 6,121,831 | A | 9/2000 | Mack |
| 6,201,442 | B1 | 3/2001 | James et al. |
| 6,466,091 | B1 | 10/2002 | Kejariwal et al. |
| 6,515,540 | B1 | 2/2003 | Prasad et al. |
| 6,525,589 | B1 | 2/2003 | Thomsen et al. |
| 6,657,487 | B2 | 12/2003 | Lauffenburger et al. |
| 7,002,409 | B1 | 2/2006 | Aram |
| 7,276,965 | B1 | 10/2007 | Sutardja |
| 7,276,969 | B1 | 10/2007 | Aram |
| 7,312,659 | B1 | 12/2007 | Aram |

OTHER PUBLICATIONS

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

(Continued)

*Primary Examiner*—Khanh V Nguyen

(57) ABSTRACT

A transimpedance amplifier (TIA) includes N cascaded pairs of transconductance amplifiers, where N is an integer greater than 1. Each one of the N cascaded pairs includes a first transconductance amplifier having an input and an output, and a second transconductance amplifier having an input that communicates with the output of the first transconductance amplifier and an output. Each one of the N cascaded pairs includes a first resistance having first and second ends that communicate with the input and the output of the second transconductance amplifier, respectively. The TIA further includes a second resistance having a first end that communicates with the input of the first transconductance amplifier of a first one of the N cascaded pairs, and a second end that communicates with the output of the second transconductance amplifier of a last one of the N cascaded pairs.

21 Claims, 19 Drawing Sheets

OTHER PUBLICATIONS

Axel Thomsen, Edwin de Angel, Sherry Ziachong Wu, Aryesh Amar, Lei Wang, Wai Lee, WA 20.1 A DC Measurement IC with 130nVpp Noise in 10Hz; 2000 IEEE International Solid-State Circuits Conference; 9 pages.

Axel Thomsen, Edwin de Angel, Sherry Ziachong Wu, Aryesh Amar, Lei Wang, Wai Lee, WA 20.1 A DC Measurement IC with 130nVpp Noise in 10Hz; ISSCC 2000/Session 20/Oversampled Converters/ Paper WA 20.1 ISSCC 2000 Slide Supplement; 5 pages.

IEEE P802.11g/D8.2, Apr. 2003 (Supplement to ANSI/IEEE Std 802.11-1999(Reaff 2003)); DRAFT Supplement to STANDARD [for] Information Technology—Telecommunications and information exchange between systems —Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Standard 802.16-2001, IEEE Standard for Local and metropolitan area networks, Part 16: Air Interface for Fixed Broadband Wireless Access Systems, pp. 1-349.

IEEE Std 802.11a-1999 (Supplement to IEEE Std 802.11-1999) [Adopted by ISO/IEC and redesignated as ISO/IEC 8802-11: 1999/ Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE Std. 802.11n; IEEE P802.11-04/0889r6; Wireless LANs, TGn Sync Proposal Technical Specification; 131 pages.

M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages.

Specification of the Bluetooth System Master Table of Contents & Compliance Requirements; Covered Core Package version: 2.0+EDR Current Master TOC issued: Nov. 4, 2004; pp. 1-72; pp. 1-92; pp. 1-812.

W. Grise, Dept. of IET, Morehead State University, Morehead, KY; Application of the Operational Transconductance Amplifier (OTA) to Voltage-controlled Amplifiers and Active Filters; 10 pages.

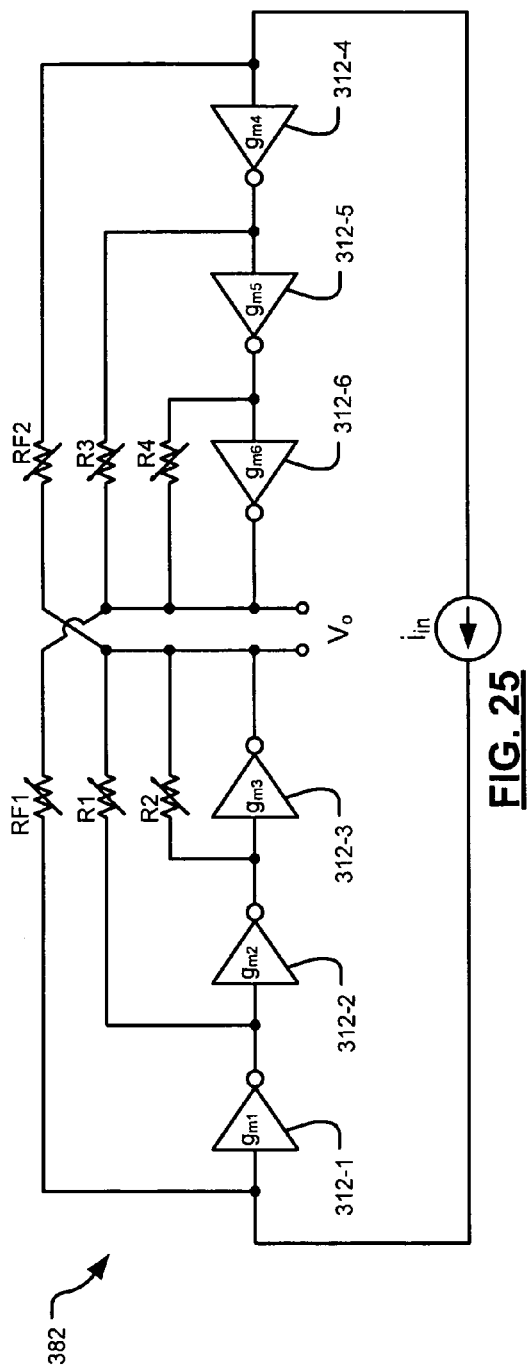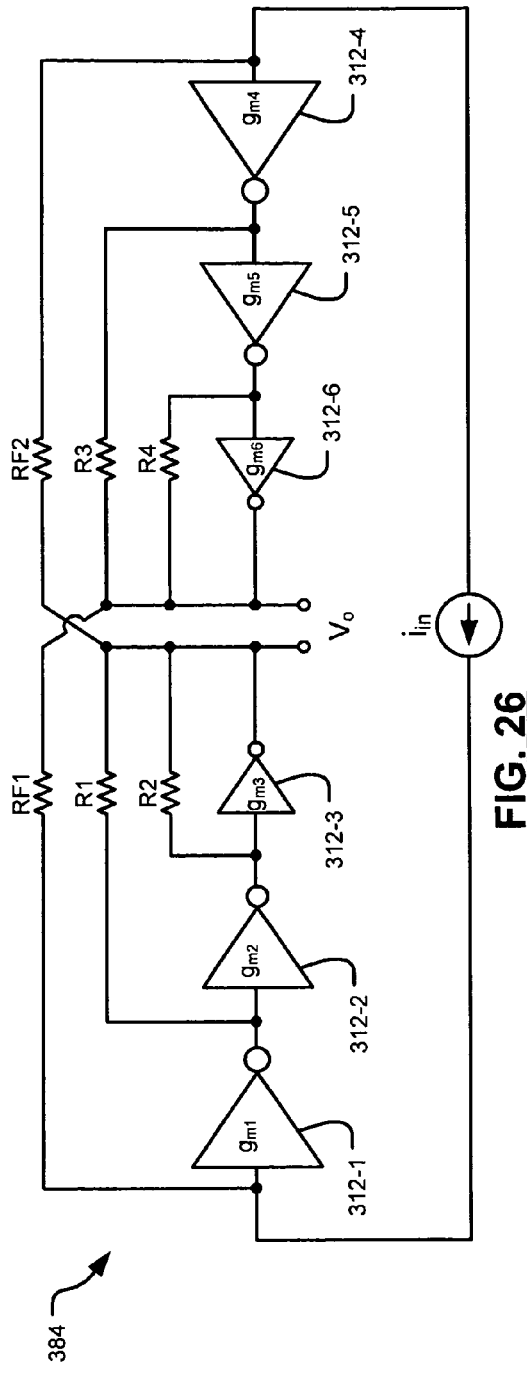

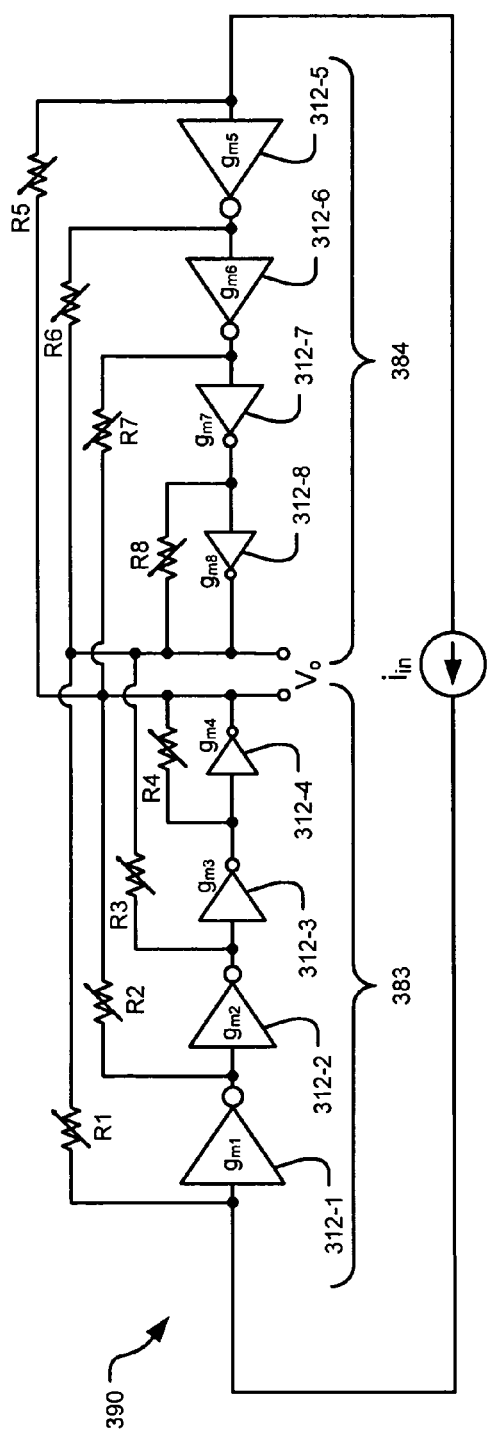
FIG. 29
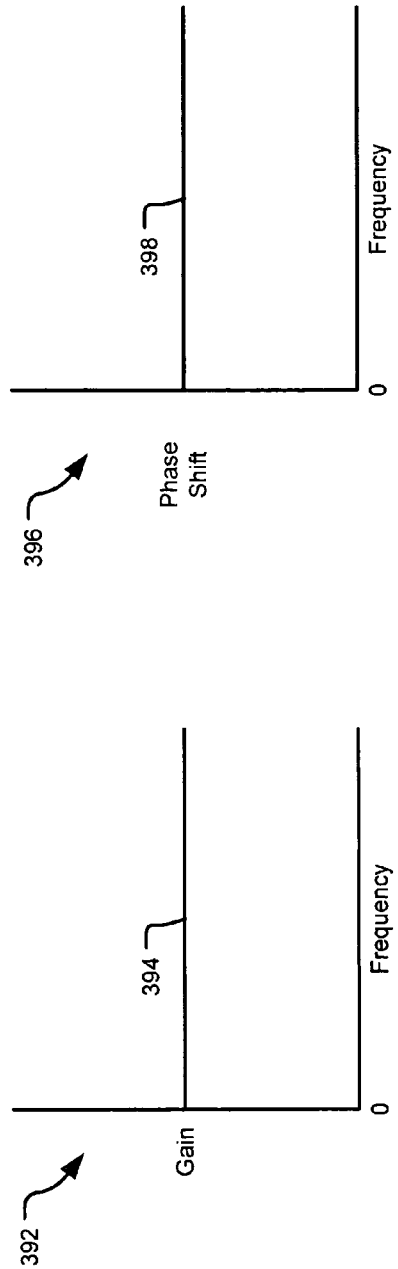
FIG. 30
FIG. 31

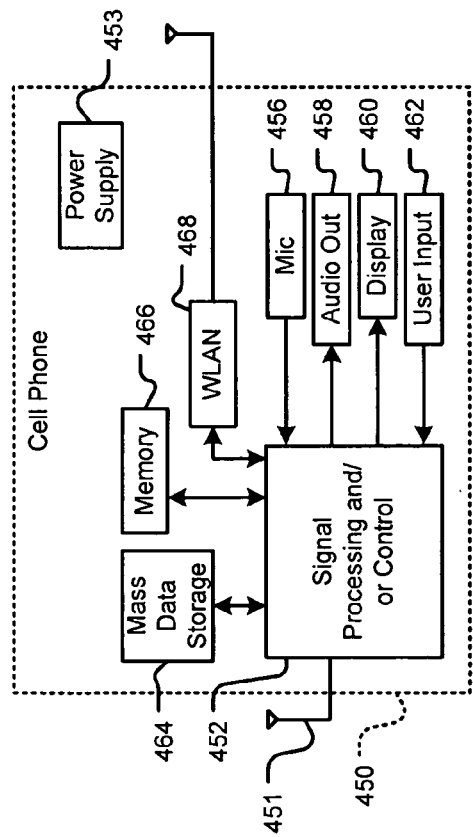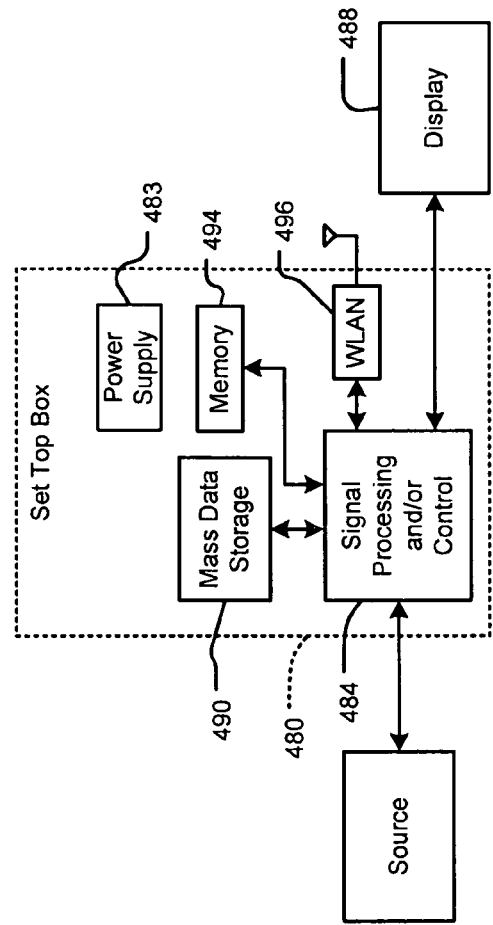
FIG. 32E
FIG. 32F

MULTI-AMPLIFIER CIRCUIT

CROSS-REFERENCE TO RELATED APPLICATIONS

This application is a continuation of U.S. patent application Ser. No. 12/004,126, filed Dec. 20, 2007, which is a divisional of U.S. patent application Ser. No. 11/504,348, filed Aug. 15, 2006, now U.S. Pat. No. 7,312,659, issued Dec. 25, 2007, which application is a continuation-in-part of U.S. patent application Ser. No. 10/792,619, filed Mar. 3, 2004, now U.S. Pat. No. 7,276,969, issued Oct. 2, 2007, all of which are incorporated herein by reference in their entirety.

FIELD OF THE INVENTION

The present invention relates to amplifier circuits, and more particularly to multi-stage amplifier circuits.

BACKGROUND OF THE INVENTION

Referring now to FIGS. 1 and 2, a transimpedance amplifier (TIA) circuit is shown and includes an inverting amplifier having a transconductance $g_m$, a load resistance $R_L$, and a feedback resistance $R_f$. As is known, the TIA circuit converts an input current $I_{in}$ to an output voltage $V_o$. Several characteristics of the amplifier circuit in FIG. 1 are described below, including gain, input impedance, output impedance, and noise. The gain of the amplifier circuit:

$$\text{Gain} = \frac{v_o}{i_{in}} = -R_f + \frac{1}{g_m}.$$

For many implementations, $R_f$ is much larger than $$\frac{1}{g_m}$$

such that the gain is essentially equal to $-R_f$.

The input impedance $R_{in}$ of the amplifier circuit of FIG. 1 is as follows:

$$R_{in} = \frac{1}{g_m}\left(1 + \frac{R_f}{R_L}\right)$$

Thus, the input impedance $R_{in}$ is a function of the load resistance $R_L$, as well as the feedback resistance $R_f$ and the transconductance $g_m$. The output impedance $R_o$ is equal to $$\frac{1}{g_m}$$

at low frequency. However, due to parasitic capacitance $C_1$, the output impedance increases to the value of the feedback resistance $R_f$ for frequencies greater than $$\frac{1}{R_f C_1},$$

as is illustrated generally in FIG. 2.

Assuming the feedback resistance $R_f$ is much greater than $$\frac{1}{g_m},$$

the noise at the input of the amplifier circuit is:

$$\text{Noise} = \frac{4KT}{g_m}$$

Thus, the noise is independent of the feedback resistance $R_f$ and the load resistance $R_L$, and inversely related to the transconductance $g_m$. Note that K is Boltzmann's constant and T is temperature. Therefore, reducing noise generally involves increasing the transconductance $g_m$.

One advantage of the amplifier circuit of FIG. 1 is that while noise is closely related to the transconductance $g_m$, the input impedance $R_{in}$ is not. Therefore, noise can be set to a desired level by adjusting the transconductance $g_m$. The desired input impedance $R_{in}$ can then be obtained by adjusting the feedback and load resistances $R_f$ and $R_L$, respectively. In this sense, the noise and input impedance of the amplifier circuit of FIG. 1 are relatively independent.

In contrast, the input impedance and noise of differential TIAs are both dependent on the transconductance $g_m$. Specifically, the input impedance $R_{in}$ is equal to $$\frac{1}{g_m}$$

and the noise is equal to $$\frac{4KT}{g_m}.$$

Accordingly, adjusting the noise level will affect the input impedance and vice versa in differential TIAs.

Referring now to FIG. 3, it is difficult to obtain high gain from a transimpedance amplifier while maintaining relatively flat input impedance and noise levels at high frequencies. As noted above, to have low noise, the transconductance $g_m$ must be relatively large. For most transistors, the transconductance $g_m$ is given by the following equation:

$$g_m = \sqrt{\frac{2KIW}{L}}$$

Where W is width, L is length, and I is current. To increase the transconductance $g_m$, the width W of the device and/or the current I can be increased. As can be seen from the following equations, however, the width W is proportional to the parasitic capacitances $C_1$ and $C_2$:

$$C_1 = C_{ox}WL; \text{ and}$$

$$C_2 \propto W.$$

Where $C_{ox}$ is oxide capacitance. Thus, increasing the width W to increase the transconductance $g_m$ also increases the parasitic capacitances $C_1$ and $C_2$. The effects of the larger parasitic capacitances on circuit performance (specifically input impedance, gain, and bandwidth) are discussed further below.

Referring now to FIG. 4, the general equation for input impedance is set forth above. However, if the value of capacitance $C_2$ increases, at some frequency it shunts the load resistance $R_L$ such that the equation for input impedance becomes:

$$R_{in} = \frac{1}{g_m}\left(1 + \frac{R_L C_2}{R_L + C_2}\right)$$

FIG. 4 illustrates this relationship. As shown therein, the input impedance is initially flat. As frequency increases, the impedance of capacitor $C_2$ decreases and begins to reduce the impedance of the parallel combination of capacitor $C_2$ and the load resistance $R_L$. This, in turn, increases the input impedance $R_{in}$ starting at a frequency of about $$\frac{1}{C_2 R_L}.$$

At even higher frequencies, the input impedance may drop off due to circuit performance, as shown in FIG. 4. Thus, one problem with the amplifier circuit of FIG. 1 is that reducing noise also requires increasing the transconductance $g_m$. Increasing the transconductance $g_m$, in turn, increases the parasitic capacitance and can adversely impact the input impedance $R_{in}$ at certain frequencies.

Referring now to FIG. 5, to achieve high gain, a high feedback resistance $R_f$ is typically needed. However, the transistor has an output impedance $r_o$ and a load impedance $R_L$. Usually $R_L$ is much greater than $r_o$. The equation for $r_o$ is:

$$r_o = \frac{T \cdot L}{g_m}.$$

Where T represents a constant typically having a value of about 100 and L represents the length of the device. Therefore, given a value for $$\frac{1}{g_m}$$

of 5 ohms and a device length of 0.25 microns, $r_o$ will be approximately 125 ohms. Assuming the load impedance $R_L$ is infinite, the equation for input impedance $R_{in}$ is:

$$R_{in} = \frac{1}{g_m} 1 + \left(\frac{R_f(R_L + r_o)}{R_L r_o}\right).$$

If an input impedance of 50 ohms is used, the feedback resistance $R_f$ is limited to approximately 1125 ohms.

Increasing the size of the device adversely impacts the input impedance $R_{in}$ at high frequencies because of the increased capacitance. Increasing the size of the device also limits the value of the load impedance $R_L$. Limiting $R_L$ also limits the value of the feedback resistance $R_f$ and adversely impacts the gain at DC.

Referring now to FIG. 6, in order to derive the bandwidth of an amplifier with feedback, an open loop response technique is used to provide information relating to the bandwidth and maximum achievable bandwidth of a circuit. The DC gain of the open loop response is determined by opening the feedback loop and attaching a voltage source to one end of the feedback loop as shown in FIG. 6. The output voltage is sensed at the other end of the feedback loop.

To derive the bandwidth, the DC gain of the open loop response and the first dominant pole $P_1$ are found. Assuming stable operation, there is only one pole $P_1$ that is located below a crossover frequency. The crossover frequency is the product of the DC gain of the open loop response and the first dominant pole $P_1$. The crossover frequency defines the bandwidth of the closed loop amplifier. The maximum available bandwidth is related to the second non-dominant pole $P_2$.

Referring now to FIG. 7, the response of the amplifier circuit of FIG. 6 is shown. The DC gain of the open loop response is $g_m R_L$ and the circuit has a dominant pole at $$\frac{1}{R_f(C_1 + C_2)}.$$

Multiplying the DC gain of the open loop response with $P_1$ provides a crossover frequency of $$\frac{g_m R_L}{R_f(C_1 + C_2)}.$$

Further the circuit arrangement has a non-dominant pole at $$\frac{1}{C_L R_2},$$

which relates to a barrier frequency or maximum achievable bandwidth. Increasing the transconductance $g_m$ increases the parasitic capacitances $C_1$, $C_2$. If the load impedance $R_L$ is less than the feedback resistance $R_f$, then the second component of the equation (i.e., $$\frac{R_L}{R_f}\Bigg)$$

is less than unity. Thus, it should be understood that there is a maximum bandwidth that can be obtained, which is basically $$\frac{g_m}{C},$$

which limits the speed of the circuit.

SUMMARY OF THE INVENTION

A differential transimpedance amplifier (TIA) circuit includes first, second, third and fourth transconductance amplifiers that each have an input, an output and a transconductance gain. The output of the first transconductance amplifier communicates with the input of the second transconductance amplifier. The output of the second transconductance amplifier communicates with the input of the third transconductance amplifier. The output of the third transconductance amplifier communicates with the input of the fourth transconductance amplifier. A first resistance has ends that communicate with the input and the output of the second transconductance amplifier, respectively. A second resistance has ends that communicate with the input and the output of the fourth transconductance amplifier, respectively. Fifth, sixth, seventh and eighth transconductance amplifiers each have an input, an output and a transconductance gain. The output of the fifth transconductance amplifier communicates with the input of the sixth transconductance amplifier. The output of the sixth transconductance amplifier communicates with the input of the seventh transconductance amplifier. The output of the seventh transconductance amplifier communicates with the input of the eighth transconductance amplifier. A third resistance has one end that communicates with the input of the first transconductance amplifier and an opposite end that communicates with the output of the eighth transconductance amplifier.

In some features a fourth resistance has ends that communicate with the input and the output of the sixth transconductance amplifier, respectively. A fifth resistance has ends that communicate with the input and the output of the eighth transconductance amplifier, respectively. A sixth resistance has one end that communicates with the input of the fifth transconductance amplifier and an opposite end that communicates with the output of the fourth transconductance amplifier. The first transconductance gain is greater than the second transconductance gain and the third transconductance gain is greater than the fourth transconductance gain. The first transconductance amplifier is larger than the second transconductance amplifier and the third transconductance amplifier is larger than the fourth transconductance amplifier. At least one of the first, second, third, fourth, fifth and sixth resistances are variable resistances. An input signal is applied to inputs of the first and fifth transconductance amplifiers and an output signal is taken at the outputs of the fourth and eighth transconductance amplifiers.

A differential transimpedance amplifier (TIA) circuit includes a first transconductance amplifier that has an input, an output and a first transconductance gain. A second transconductance amplifier has an input that communicates with the output of the first transconductance amplifier, an output and a second transconductance gain. A third transconductance amplifier has an input that communicates with the output of the second transconductance amplifier, an output and a third transconductance gain. A first resistance has one end that communicates with the output of the third transconductance amplifier and an opposite end that communicates with the input of the second transconductance amplifier. A second resistance has one end that communicates with the output of the third transconductance amplifier and an opposite end that communicates with the input of the third transconductance amplifier. A fourth transconductance amplifier has an input, an output and a fourth transconductance gain. A fifth transconductance amplifier has an input that communicates with the output of the fourth transconductance amplifier, an output and a fifth transconductance gain. A sixth transconductance amplifier has an input that communicates with the output of the fifth transconductance amplifier, an output and a sixth transconductance gain. A third resistance has one end that communicates with the output of the sixth transconductance amplifier and an opposite end that communicates with the input of the fifth transconductance amplifier. A fourth resistance has one end that communicates with the output of the sixth transconductance amplifier and an opposite end that communicates with the input of the sixth transconductance amplifier. A fifth resistance has one end that communicates with the output of the third transconductance amplifier and an opposite end that communicates with the input of the fourth transconductance amplifier. A sixth resistance has one end that communicates with the output of the sixth transconductance amplifier and an opposite end that communicates with the input of the first transconductance amplifier.

In other features an input signal is input to the inputs of the first and third transconductance amplifiers and an output signal is taken across the outputs of the third and sixth transconductance amplifiers. The first transconductance gain is greater than the second transconductance gain. The second transconductance gain is greater than the third transconductance gain. The fourth transconductance gain is greater than the fifth transconductance gain. The fifth transconductance gain is greater than the sixth transconductance gain. The first transconductance amplifier is larger than the second transconductance amplifier. The second transconductance amplifier is larger than the third transconductance amplifier. The fourth transconductance amplifier is larger than the fifth transconductance amplifier. The fifth transconductance amplifier is larger than the sixth transconductance amplifier. The first, second, third, fourth, fifth, and sixth resistances are variable resistances.

A differential transimpedance amplifier (TIA) circuit includes a first transconductance amplifier that has an input, an output and a first transconductance gain. A second transconductance amplifier has an input that communicates with the output of the first transconductance amplifier, an output and a second transconductance gain. A third transconductance amplifier has an input that communicates with the output of the second transconductance amplifier, an output and a third transconductance gain. A first resistance has one end that communicates with the output of the third transconductance amplifier and an opposite end that communicates with the input of the first transconductance amplifier. A second resistance has one end that communicates with the output of the third transconductance amplifier and an opposite end that communicates with the input of the third transconductance amplifier. A fourth transconductance amplifier has an input, an output and a fourth transconductance gain. A fifth transconductance amplifier has an input that communicates with the output of the fourth transconductance amplifier, an output and a fifth transconductance gain. A sixth transconductance amplifier has an input that communicates with the output of the fifth transconductance amplifier, an output and a sixth transconductance gain. A third resistance has one end that communicates with the output of the sixth transconductance amplifier and an opposite end that communicates with the input of the fourth transconductance amplifier. A fourth resistance has one end that communicates with the output of the sixth transconductance amplifier and an opposite end that communicates with the input of the sixth transconductance amplifier. A fifth resistance has one end that communicates with the output of the third transconductance amplifier and an opposite end that communicates with the input of the fifth transconductance amplifier. A sixth resistance has one end that communicates with the output of the sixth transconductance amplifier and an opposite end that communicates with the input of the second transconductance amplifier.

In other features an input signal is input to the inputs of the first and fourth transconductance amplifiers and an output signal is taken across the outputs of the third and sixth transconductance amplifiers.

A differential transimpedance amplifier (TIA) circuit includes a first transconductance amplifier that has an input, an output and a first transconductance gain. A second transconductance amplifier has an input that communicates with the output of the first transconductance amplifier, an output and a second transconductance gain. A third transconductance amplifier has an input that communicates with the output of the second transconductance amplifier, an output and a third transconductance gain. A fourth transconductance amplifier has an input that communicates with the output of the third transconductance amplifier, an output and a fourth transconductance gain. A first resistance has one end that communicates with the output of the fourth transconductance amplifier and an opposite end that communicates with the input of the second transconductance amplifier. A second resistance has one end that communicates with the output of the fourth transconductance amplifier and an opposite end that communicates with the input of the fourth transconductance amplifier. A fifth transconductance amplifier has an input, an output and a fifth transconductance gain. A sixth transconductance amplifier has an input that communicates with the output of the fifth transconductance amplifier, an output and a sixth transconductance gain. A seventh transconductance amplifier has an input that communicates with the output of the sixth transconductance amplifier, an output and a seventh transconductance gain. An eighth transconductance amplifier has an input that communicates with the output of the seventh transconductance amplifier, an output and an eighth transconductance gain. A third resistance has one end that communicates with the output of the eighth transconductance amplifier and an opposite end that communicates with the input of the sixth transconductance amplifier. A fourth resistance has one end that communicates with the output of the eighth transconductance amplifier and an opposite end that communicates with the input of the eighth transconductance amplifier. A fifth resistance has one end that communicates with the output of the fourth transconductance amplifier and an opposite end that communicates with the input of the fifth transconductance amplifier. A sixth resistance has one end that communicates with the output of the fourth transconductance amplifier and an opposite end that communicates with the input of the seventh transconductance amplifier. A seventh resistance has one end that communicates with the output of the eighth transconductance amplifier and an opposite end that communicates with the input of the third transconductance amplifier. A eighth resistance has one end that communicates with the output of the eighth transconductance amplifier and an opposite end that communicates with the input of the first transconductance amplifier.

In other features an input signal is input to the inputs of the first and the fifth transconductance amplifiers and an output signal is taken across the outputs of the fourth and eighth transconductance amplifiers. The first transconductance gain is greater than the second transconductance gain. The second transconductance gain is greater than the third transconductance gain. The third transconductance gain is greater than the fourth transconductance gain. The fifth transconductance gain is greater than the sixth transconductance gain. The sixth transconductance gain is greater than the seventh transconductance gain. The seventh transconductance gain is greater than the eighth transconductance gain.

In other features the first transconductance amplifier is larger than the second transconductance amplifier. The second transconductance amplifier is larger than the third transconductance amplifier. The third transconductance amplifier is larger than the fourth transconductance amplifier. The fifth transconductance amplifier is larger than the sixth transconductance amplifier. The sixth transconductance amplifier is larger than the seventh transconductance amplifier. The seventh transconductance amplifier is larger than the eighth transconductance amplifier. At least one of the first, second, third, fourth, fifth, sixth, seventh and eighth resistances are variable resistances.

A differential transimpedance amplifier (TIA) circuit includes first, second, third and fourth amplifier means for amplifying, each including an input, an output and a transconductance gain. The output of the first amplifier means communicates with the input of the second amplifier means. The output of the second amplifier means communicates with the input of the third amplifier means. The output of the third amplifier means communicates with the input of the fourth amplifier means. First resistance means provide a resistance and have ends that communicate with the input and the output of the second amplifier means, respectively. Second resistance means provide a resistance and have ends that communicate with the input and the output of the fourth amplifier means, respectively. The TIA circuit also includes fifth, sixth, seventh and eighth amplifier means for amplifying, each having an input, an output and a transconductance gain. The output of the fifth amplifier means communicates with the input of the sixth amplifier means. The output of the sixth amplifier means communicates with the input of the seventh amplifier means. The output of the seventh amplifier means communicates with the input of the eighth amplifier means. The TIA circuit also includes third resistance means for providing a resistance and having one end that communicates with the input of the first amplifier means and an opposite end that communicates with the output of the eighth amplifier means.

In some features the differential TIA circuit includes fourth resistance means for providing a resistance and having ends that communicate with the input and the output of the sixth amplifier means, respectively. The TIA circuit includes fifth resistance means for providing a resistance and having ends that communicate with the input and the output of the eighth amplifier means, respectively. The TIA circuit includes sixth resistance means for providing a resistance and having one end that communicates with the input of the fifth amplifier means and an opposite end that communicates with the output of the fourth amplifier means. The first transconductance gain is greater than the second transconductance gain and the third transconductance gain is greater than the fourth transconductance gain. The first amplifier means is larger than the second amplifier means and the third amplifier means is larger than the fourth amplifier means. At least one of the first, second, third, fourth, fifth and sixth resistance means provide a variable resistance. An input signal is applied to inputs of the first and fifth amplifier means and an output signal is taken at the outputs of the fourth and eighth amplifier means.

A differential transimpedance amplifier (TIA) circuit includes first amplifier means for amplifying and having an input, an output and a first transconductance gain; second amplifier means for amplifying and having an input that communicates with the output of the first amplifier means, an output and a second transconductance gain. Third amplifier means amplify and have an input that communicates with the output of the second amplifier means, an output and a third transconductance gain. First resistance means provide a resistance and have one end that communicates with the output of the third amplifier means and an opposite end that communicates with the input of the second amplifier means. Second resistance means provide a resistance and have one end that communicates with the output of the third amplifier means and an opposite end that communicates with the input of the third amplifier means. Fourth amplifier means amplify and have an input, an output and a fourth transconductance gain.

Fifth amplifier means amplify and have an input that communicates with the output of the fourth amplifier means, an output and a fifth transconductance gain. Sixth amplifier means amplify and have an input that communicates with the output of the fifth amplifier means, an output and a sixth transconductance gain. Third resistance means provide a resistance and have one end that communicates with the output of the sixth amplifier means and an opposite end that communicates with the input of the fifth amplifier means. Fourth resistance means provide a resistance and have one end that communicates with the output of the sixth amplifier means and an opposite end that communicates with the input of the sixth amplifier means. Fifth resistance means provide a resistance and have one end that communicates with the output of the third amplifier means and an opposite end that communicates with the input of the fourth amplifier means. Sixth resistance means provide a resistance and have one end that communicates with the output of the sixth amplifier means and an opposite end that communicates with the input of the first amplifier means.

In other features an input signal is input to the inputs of the first and third amplifier means and an output signal is taken across the outputs of the third and sixth amplifier means. The first transconductance gain is greater than the second transconductance gain, the second transconductance gain is greater than the third transconductance gain, the fourth transconductance gain is greater than the fifth transconductance gain and the fifth transconductance gain is greater than the sixth transconductance gain. The first amplifier means is larger than the second amplifier means, the second amplifier means is larger than the third amplifier means, the fourth amplifier means is larger than the fifth amplifier means and the fifth amplifier means is larger than the sixth amplifier means. The first, second, third, fourth, fifth, and sixth resistance means provide variable resistances.

A differential transimpedance amplifier (TIA) circuit includes first amplifier means for amplifying and has an input, an output and a first transconductance gain. Second amplifier means amplify and have an input that communicates with the output of the first amplifier means, an output and a second transconductance gain. Third amplifier means amplify and have an input that communicates with the output of the second amplifier means, an output and a third transconductance gain. First resistance means provide a resistance and have one end that communicates with the output of the third amplifier means and an opposite end that communicates with the input of the first amplifier means. Second resistance means provide a resistance and have one end that communicates with the output of the third amplifier means and an opposite end that communicates with the input of the third amplifier means. Fourth amplifier means amplify and have an input, an output and a fourth transconductance gain. Fifth amplifier means amplify and have an input that communicates with the output of the fourth amplifier means, an output and a fifth transconductance gain. Sixth amplifier means amplify and have an input that communicates with the output of the fifth amplifier means, an output and a sixth transconductance gain. Third resistance means provide a resistance and have one end that communicates with the output of the sixth amplifier means and an opposite end that communicates with the input of the fourth amplifier means. Fourth resistance means provide a resistance and have one end that communicates with the output of the sixth amplifier means and an opposite end that communicates with the input of the sixth amplifier means. Fifth resistance means provide a resistance and have one end that communicates with the output of the third amplifier means and an opposite end that communicates with the input of the fifth amplifier means. Sixth resistance means provide a resistance and have one end that communicates with the output of the sixth amplifier means and an opposite end that communicates with the input of the second amplifier means.

In other features an input signal is input to the inputs of the first and fourth amplifier means and an output signal is taken across the outputs of the third and sixth amplifier means.

A differential transimpedance amplifier (TIA) circuit includes first amplifier means for amplifying and has an input, an output and a first transconductance gain. Second amplifier means amplify and have an input that communicates with the output of the first amplifier means, an output and a second transconductance gain. Third amplifier means amplify and have an input that communicates with the output of the second amplifier means, an output and a third transconductance gain. Fourth amplifier means amplify and have an input that communicates with the output of the third amplifier means, an output and a fourth transconductance gain. First resistance means provide a resistance and have one end that communicates with the output of the fourth amplifier means and an opposite end that communicates with the input of the second amplifier means. Second resistance means provide a resistance and have one end that communicates with the output of the fourth amplifier means and an opposite end that communicates with the input of the fourth amplifier means. Fifth amplifier means amplify and have an input, an output and a fifth transconductance gain. Sixth amplifier means amplify and have an input that communicates with the output of the fifth amplifier means, an output and a sixth transconductance gain. Seventh amplifier means amplify and have an input that communicates with the output of the sixth amplifier means, an output and a seventh transconductance gain. Eighth amplifier means amplify and have an input that communicates with the output of the seventh amplifier means, an output and an eighth transconductance gain. Third resistance means provide a resistance and have one end that communicates with the output of the eighth amplifier means and an opposite end that communicates with the input of the sixth amplifier means. Fourth resistance means provide a resistance and have one end that communicates with the output of the eighth amplifier means and an opposite end that communicates with the input of the eighth amplifier means. Fifth resistance means provide a resistance and have one end that communicates with the output of the fourth amplifier means and an opposite end that communicates with the input of the fifth amplifier means. Sixth resistance means provide a resistance and have one end that communicates with the output of the fourth amplifier means and an opposite end that communicates with the input of the seventh amplifier means. Seventh resistance means provide a resistance and have one end that communicates with the output of the eighth amplifier means and an opposite end that communicates with the input of the third amplifier means. Eighth resistance means provide a resistance and have one end that communicates with the output of the eighth amplifier means and an opposite end that communicates with the input of the first amplifier means.

In other features an input signal is input to the inputs of the first and the fifth amplifier means and an output signal is taken across the outputs of the fourth and eighth amplifier means. The first transconductance gain is greater than the second transconductance gain, the second transconductance gain is greater than the third transconductance gain, the third transconductance gain is greater than the fourth transconductance gain, the fifth transconductance gain is greater than the sixth transconductance gain, the sixth transconductance gain is greater than the seventh transconductance gain and the seventh transconductance gain is greater than the eighth transconductance gain. The first amplifier means is larger than the second amplifier means, the second amplifier means is larger than the third amplifier means, the third amplifier means is larger than the fourth amplifier means, the fifth amplifier means is larger than the sixth amplifier means, the sixth amplifier means is larger than the seventh amplifier means and the seventh amplifier means is larger than the eighth amplifier means. At least one of the first, second, third, fourth, fifth, sixth, seventh and eighth resistance means provide a variable resistance.

A transimpedance amplifier (TIA) circuit including first, second and third transconductance amplifiers each having an input, an output and a transconductance gain. The output of the first transconductance amplifier communicates with the input of the second transconductance amplifier. The output of the second transconductance amplifier communicates with the input of the third transconductance amplifier. A first resistance has first and second ends that communicate with the input and the output of the third transconductance amplifier, respectively. A second resistance has one end that communicates with the output of the third transconductance amplifier and an opposite end that communicates with the input of the second transconductance amplifier.

A transimpedance amplifier (TIA) circuit includes first, second and third amplifier means for amplifying. Each amplifying means has an input, an output and a transconductance gain. The output of the first amplifier means communicates with the input of the second amplifier means. The output of the second amplifier means communicates with the input of the third amplifier means. First resistance means provide a resistance and have first and second ends that communicate with the input and the output of the third amplifier means, respectively. Second resistance means provide a resistance and have one end that communicates with the output of the third amplifier means and an opposite end that communicates with the input of the second amplifier means.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 25 is a schematic diagram of the differential multistage TIA of FIG. 24 that employs variable resistances;

FIG. 26 is a schematic diagram of the differential multistage TIA of FIG. 24 that employs transconductance amplifiers having different sizes;

FIG. 29 is a schematic diagram of the differential multistage TIA of FIG. 27 that employs transconductance amplifiers having different sizes;

FIG. 30 is a plot of the overall gain of the multistage TIAs of FIGS. 27-29;

FIG. 31 is a plot of the overall phase shift of the multistage TIAs of FIGS. 27-29;

FIG. 32E is a functional block diagram of a cellular phone;

FIG. 32F is a functional block diagram of a set top box; and

DETAILED DESCRIPTION OF THE PREFERRED EMBODIMENTS

Figure 1:
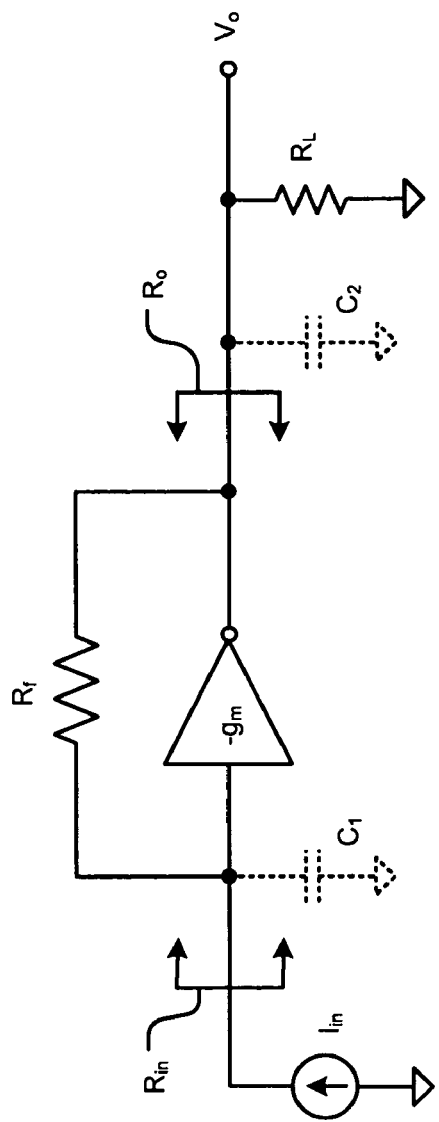
FIG. 1 is an electrical schematic of a transimpedance amplifier circuit according to the prior art.
Figure 2:
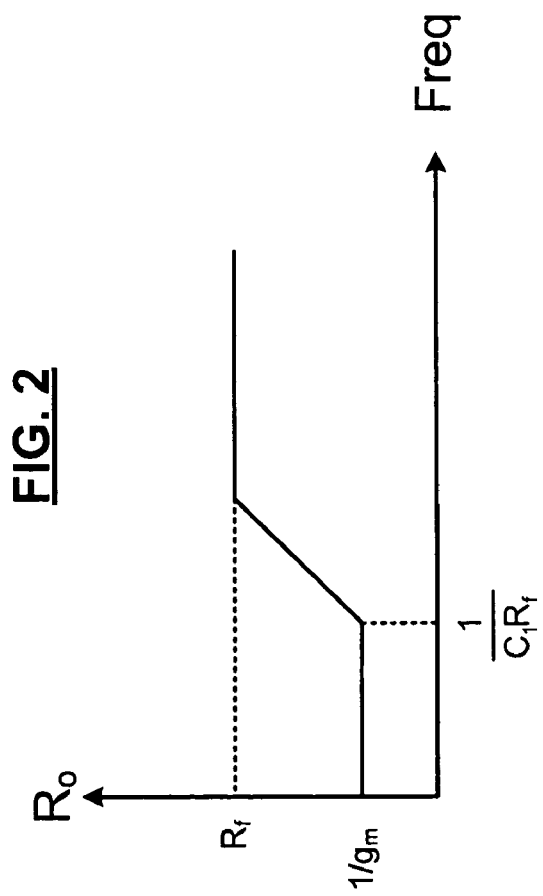
FIG. 2 is a graph illustrating output impedance as a function of frequency for the amplifier circuit of FIG. 1.
Figure 4:
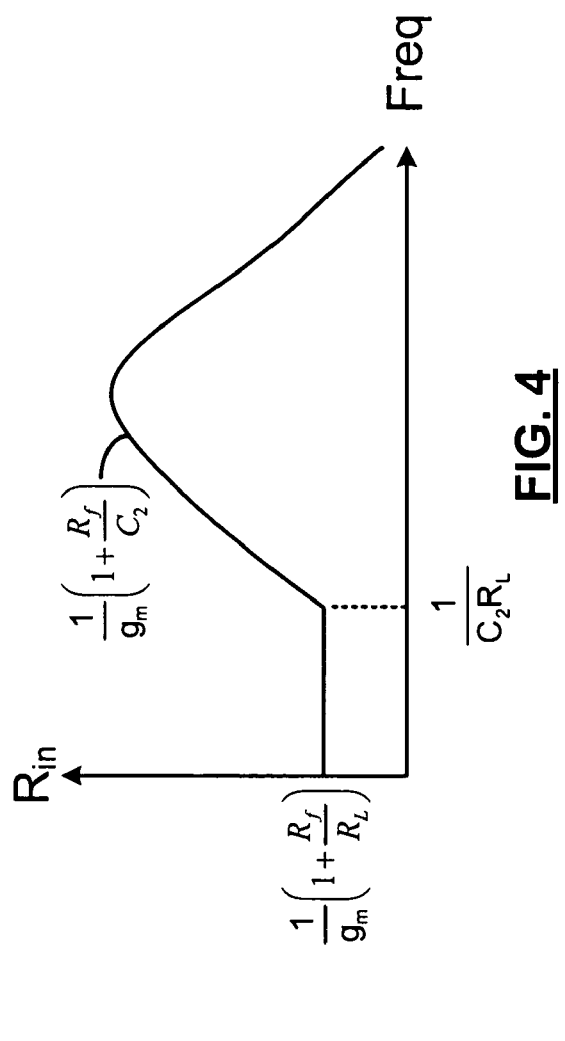
FIG. 4 is a graph illustrating input impedance as a function of frequency for the amplifier of FIG. 1.
Figure 3:
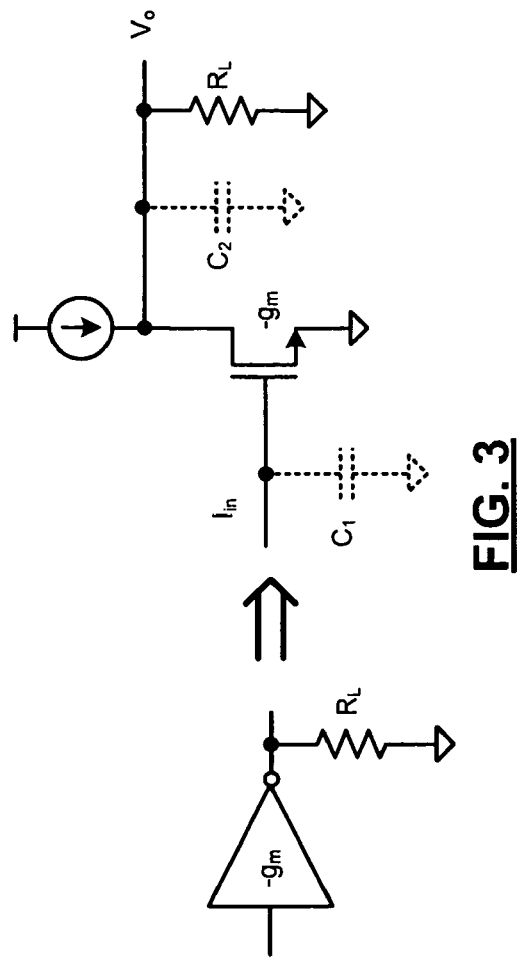
FIG. 3 is an electrical schematic of a transistor with parasitic capacitances according to the prior art.
Figure 5:
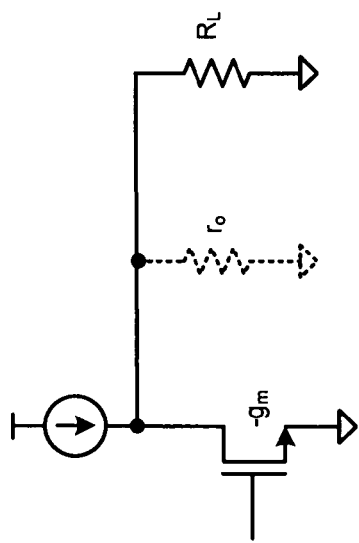
FIG. 5 is an electrical schematic illustrating the output resistance of the transistor of FIG. 3.
Figure 6:
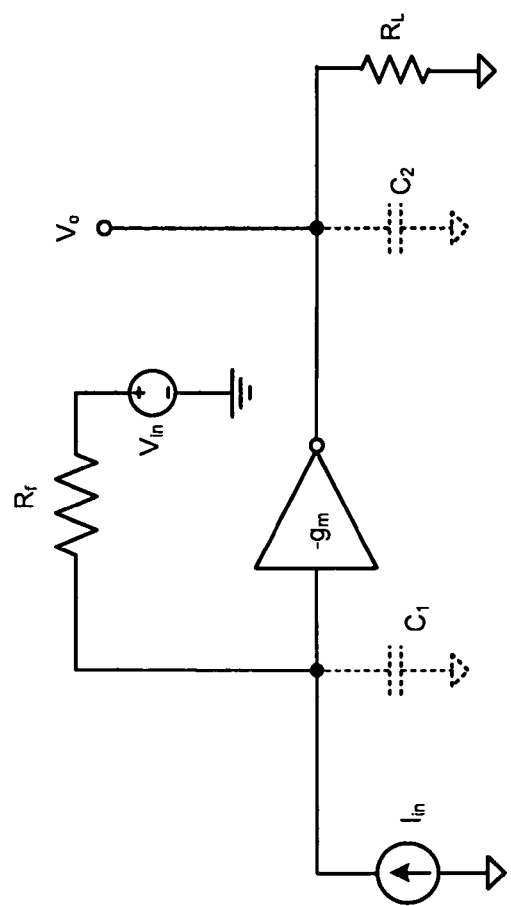
FIG. 6 is the amplifier circuit of FIG. 1 in an open loop response configuration.
Figure 7:
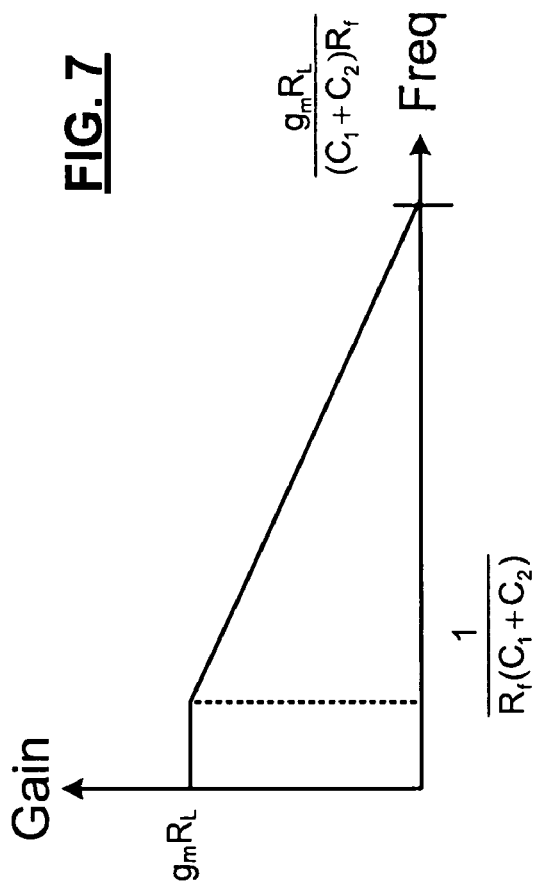
FIG. 7 illustrates the open loop response of the circuit shown in FIG. 6.

The following description of the preferred embodiment(s) is merely exemplary in nature and is in no way intended to limit the invention, its application, or uses. For purposes of clarity, the same reference numbers will be used in the drawings to identify similar elements.

Figure 8:
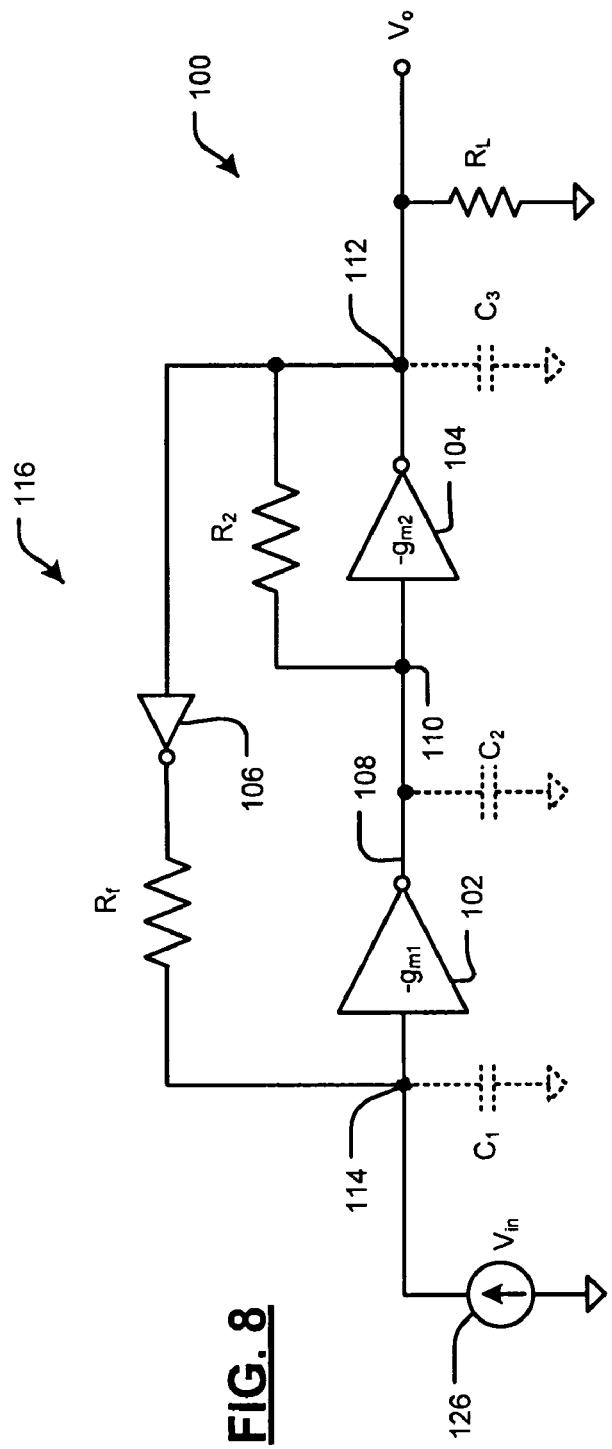
FIG. 8 is an electrical schematic of an amplifier circuit according to one embodiment of the present invention.

An amplifier circuit according to one embodiment of the present invention is illustrated in FIG. 8 and is designated by reference number 100. The circuit 100 includes a first amplifier 102 having a transconductance $g_{m1}$ and a second amplifier 104 having a transconductance $g_{m2}$. The first and second amplifiers 102, 104 are connected in series. Specifically, an output 108 of the first amplifier 102 is coupled to an input 110 of the second amplifier 104.

An output 112 of the second amplifier 104 is coupled to an input 114 of the first amplifier 102 through a feedback circuit 116. The feedback circuit 116 includes a feedback resistance $R_f$ and an inverter 106. In one implementation, the inverter 106 has a gain equal to −1, although other gain values can be used. A resistance $R_2$ is coupled in parallel with the second amplifier 104. Also shown in FIG. 8 are parasitic capacitances $C_1$, $C_2$, and $C_3$. An input current source $I_{in}$ 126 is coupled to the input terminal 114 of the first amplifier 102. A load resistance $R_L$ is coupled to the output terminal 112 of the second amplifier 104. In this implementation, $g_{m1}$ is preferably greater than $g_{m2}$. The amplifiers 102, 104 can be inverting CMOS amplifiers (although other transistor types may be used), and the parasitic capacitances $C_1$ and $C_2$ are preferably much larger than the parasitic capacitance $C_3$.

Figure 9:
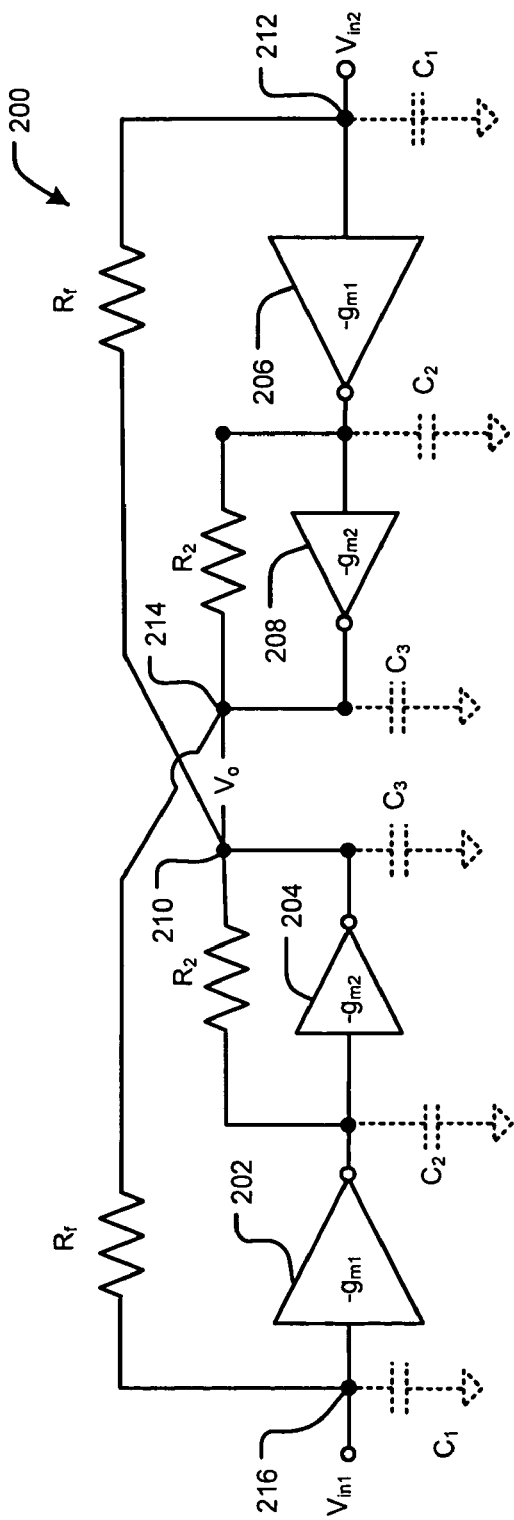
FIG. 9 is an electrical schematic of a differential circuit implementation of the circuit of FIG. 8.

Referring now to FIG. 9, a differential circuit 200 corresponding to the circuit 100 shown in FIG. 8 is illustrated. The differential circuit 200 includes a first set of amplifiers 202, 204 connected in series and having transconductances $g_{m1}$ and $g_{m2}$, respectively. A second set of amplifiers 206, 208 are connected in series and have transconductances $g_{m1}$ and $g_{m2}$, respectively. An output 210 of the first set of amplifiers is coupled to an input 212 of the second set of amplifiers through a feedback resistance $R_f$. An output 214 of the second set of amplifiers is coupled to an input 216 of the first set of amplifiers through a feedback resistance $R_f$. Negative feedback is achieved by feeding the output 210 from the first set of amplifiers to the input 212 of the second set of amplifiers 206, 208, and vice versa.

The effective transconductance $g_{m\text{-}eff}$ of the differential circuit 200 of FIG. 9 is given by the following equation:

$$g_{m\text{-}eff} = \frac{g_m R_2}{\frac{R_L}{g_{m2} R_L + 1}}$$

$$\approx g_{m2} \cdot g_{m1} \cdot R_2.$$

Therefore, the overall transconductance for the differential circuit 200 is greater than the amplifier circuit that is shown in FIG. 1. Even if amplifiers 202, 206 have the same transconductance $g_m$ as the amplifier of FIG. 1, the overall transconductance $g_{m\text{-}eff}$ is the product of this transconductance multiplied by $g_{m2}$ and $R_2$ for the circuit of FIG. 9.

The input impedance for the differential circuit of FIG. 9 is as follows:

$$R_{in} = \frac{1}{g_{m\_eff}}\left(1 + \frac{Rf}{R_L}\right)$$

$$\Rightarrow \frac{1}{g_{m2} g_{m1} R_2}\left(1 + \frac{Rf}{1/g_m}\right)$$

$$\approx \frac{1}{g_{m2} g_{m1} R_2} + R_f g_{m1} R_2$$

Note that, in this embodiment, $R_L$ is not shunted because the parasitic capacitance $C_3$ is relatively low. Therefore, the differential circuit 200 is capable of higher frequency operation than the amplifier circuit of FIG. 1.

Figure 10:
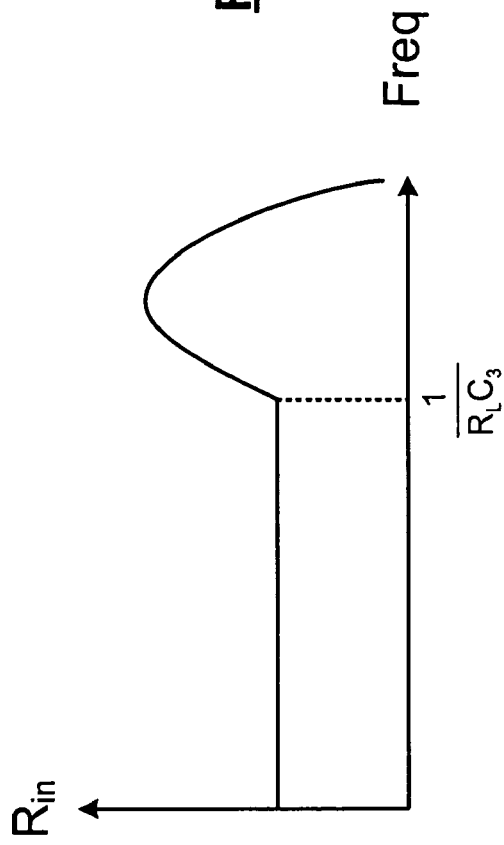
FIG. 10 is a graph illustrating input impedance as a function of frequency for the differential circuit of FIG. 9.

Referring now to FIG. 10, the input impedance is shown as a function of frequency. The input impedance is relatively flat or constant to a higher frequency (i.e., $$\frac{1}{R_L C_3})$$

as compared to the input impedance for the circuit of FIG. 1. Moreover, in the differential circuit of FIG. 9, the value of the feedback resistance $R_f$ can be increased as desired for increased gain because this resistance $R_f$ is not limited by the output impedance as in FIG. 1.

Relative to the amplifier circuit of FIG. 1, the output impedance of the amplifier circuits shown in FIGS. 8 and 9 is also increased because the second amplifier 104 has a low transconductance $g_{m2}$ and a high output impedance. Thus, the overall output impedance is not limited by the second amplifier 104, and is merely limited by the load impedance $R_L$. The noise of the amplifier circuits 100, 200 is similar to the amplifier circuit of FIG. 1 because the noise of the first amplifier 102 dominates the overall noise for the circuit, and the noise generated by the second amplifier 104 is divided by $g_{m1}$.

Figure 11:
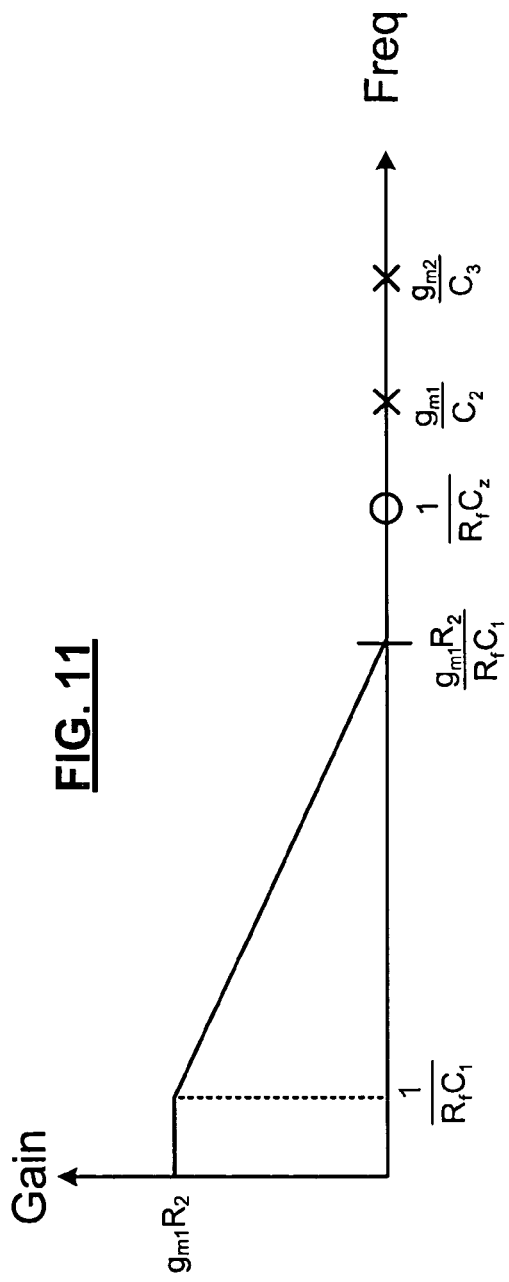
FIG. 11 illustrates the open loop response of the differential circuit of FIG. 9.

Referring now to FIG. 11, the open loop response of the differential circuit of FIG. 9 is illustrated using the open loop response technique described above. As shown therein, at DC, the capacitor $C_1$ is effectively an open circuit and the input impedance is high, so the DC gain of the open loop response is equal to $g_{m1} \cdot R_2$. There is a dominant pole at $$\frac{1}{R_f C_1}$$

and the crossover frequency is $$\left(\frac{g_{m1} \cdot R_2}{R_f C_1}\right).$$

As compared to the amplifier circuit of FIG. 1, the crossover frequency is determined by the resistance $R_2$ rather than the load impedance $R_L$. Therefore, the resistance $R_2$ can be increased to increase bandwidth. Further, the crossover frequency is a function of one capacitor $C_1$ not two. Thus, given the same transconductance $g_{m1}$ as the circuit of FIG. 1, the bandwidth of the differential circuit 200 will be greater. However, there are two nondominant poles at $$\frac{g_{m1}}{C_2}$$

and $$\frac{g_{m2}}{C_3}.$$

These poles set an upper limit on the differential circuit's bandwidth.

Figure 12:
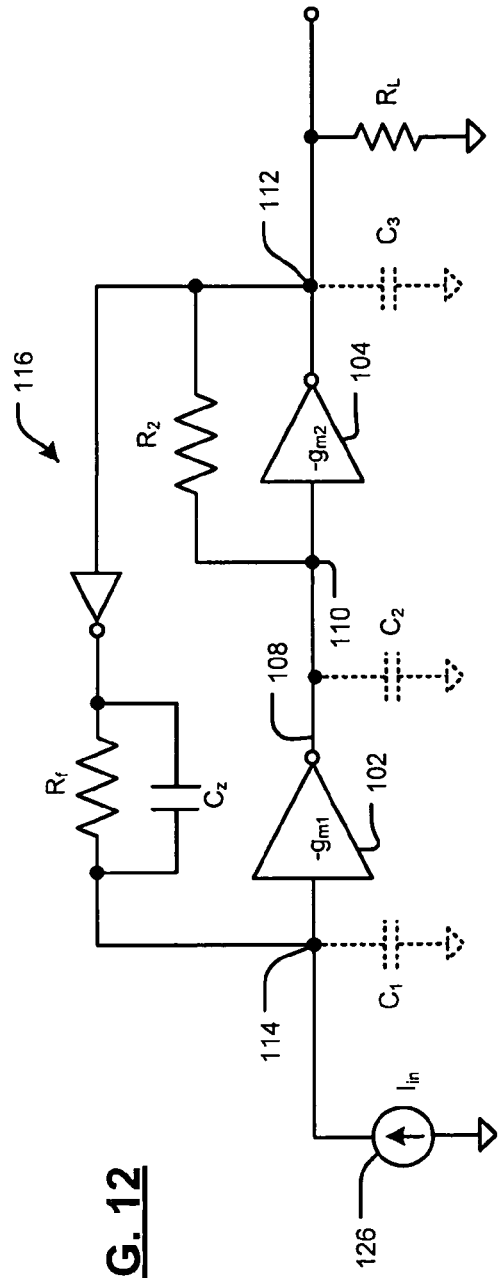
FIG. 12 is an electrical schematic of an amplifier circuit according to another embodiment of the present invention.

Referring now to FIG. 12, to mitigate this problem, a capacitor $C_z$ can be coupled in parallel across the feedback resistance $R_f$ in the differential mode, as shown in the half-circuit illustrated in FIG. 12. The capacitor $C_2$ adds a zero at a frequency of $$\frac{1}{R_f C_z}$$

as shown in FIG. 11.

Figure 13:
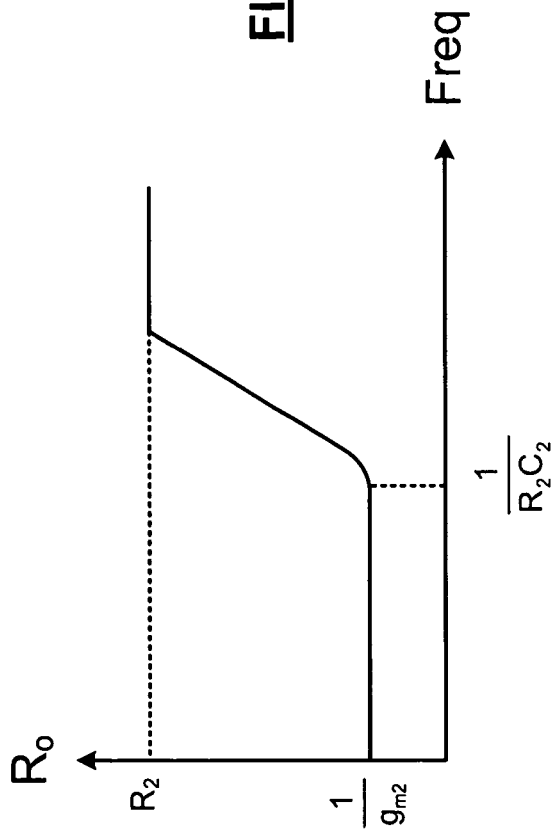
FIG. 13 is a graph illustrating the output impedance as a function of frequency for the differential circuit of FIG. 9.

Referring now to FIG. 13, the transconductance $g_{m1}$ is noise dependent and is typically set to a level corresponding to minimal noise. Therefore, the transconductance $g_{m1}$ cannot be further increased to further enhance the bandwidth of the differential circuit 200. The feedback resistance $R_f$ is set by the input impedance $R_{in}$, so those two variables are generally fixed. As the resistance $R_2$ is increased to increase bandwidth, at some point the output impedance is affected. This is illustrated in FIG. 13, where it can be seen that the output impedance $R_o$ of the differential circuit 200 is relatively constant or flat up to a frequency of approximately $$\frac{1}{R_2 C_2}.$$

Moreover, and with further reference to FIG. 11, at a frequency of $$g_{m2} = \frac{R_2}{C_2},$$

$R_o$ increases. Therefore, by increasing the resistance $R_2$, one of the nondominant poles moves down in frequency, which limits bandwidth. For all of these reasons, the resistance $R_2$ generally cannot be increased without restraint.

Figure 14:
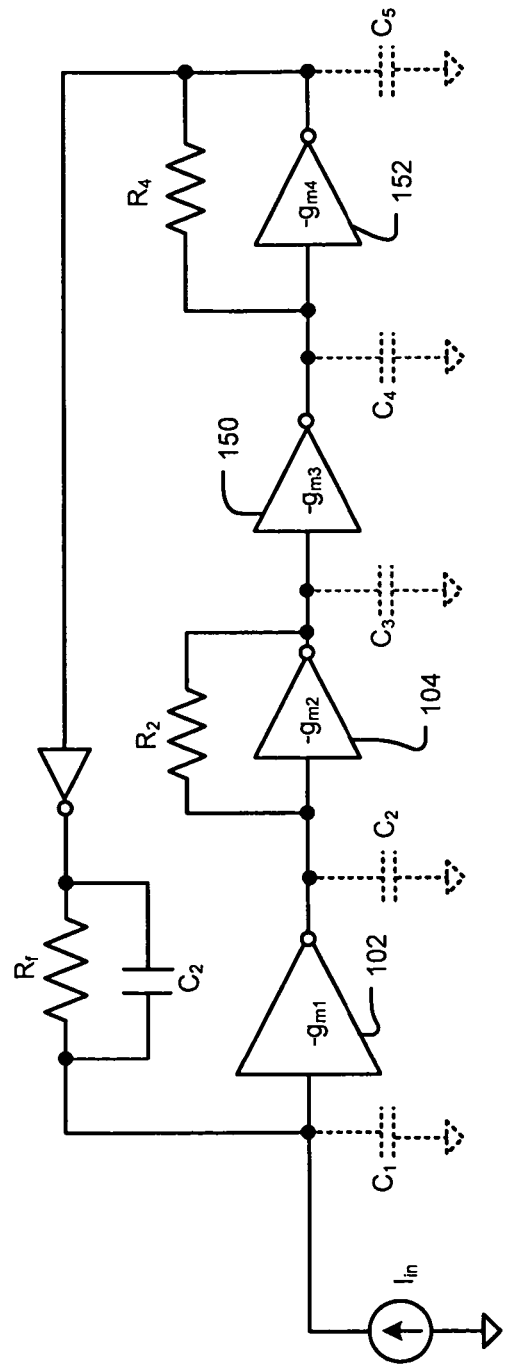
FIG. 14 is an electrical schematic of an amplifier circuit including additional amplifier stages according to yet another embodiment of the present invention.

Referring now to FIG. 14, another embodiment of an amplifier circuit is shown that mitigates the problems described above by increasing the transconductance $g_{m2}$ of the second amplifier 104, adding amplifiers 150, 152, and reducing the resistance $R_2$. In the embodiment of FIG. 14, the transconductance of the amplifier 104 is approximately one-quarter of the amplifier 102. The transconductance of amplifiers 150, 152 are approximately one-twelfth of amplifier 102. As used herein, the term approximately means within +/−0.25% of the designated value.

Figure 15:
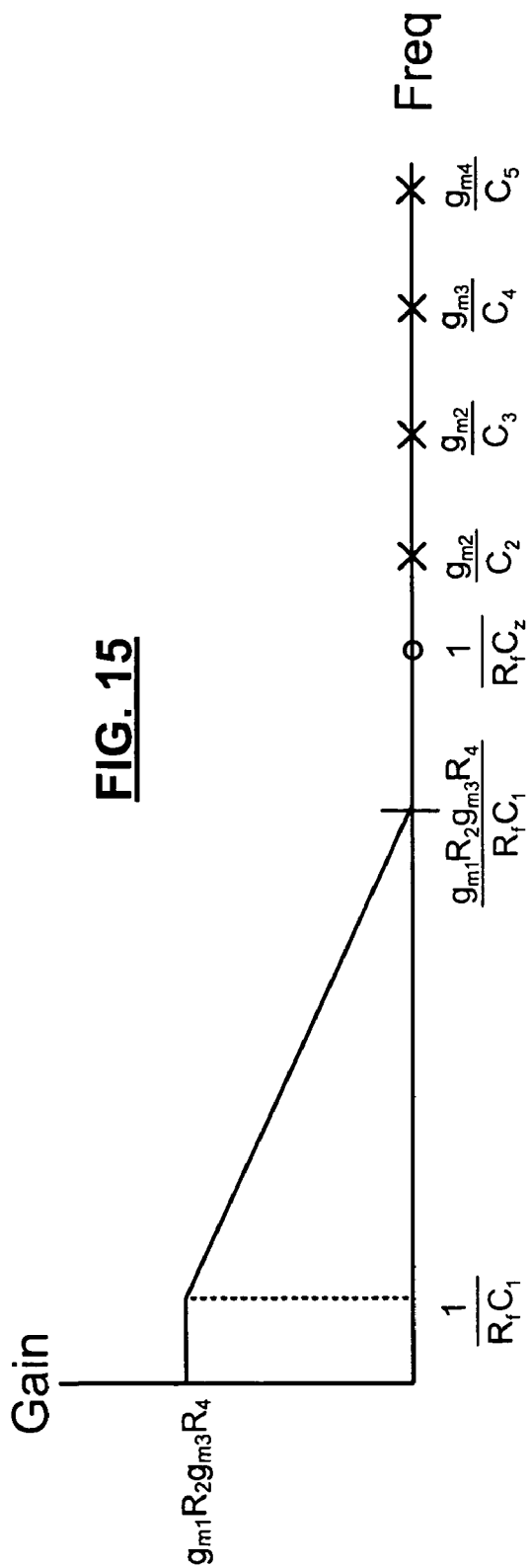
FIG. 15 illustrates the open loop response of the circuit of FIG. 14.
Figure 16:
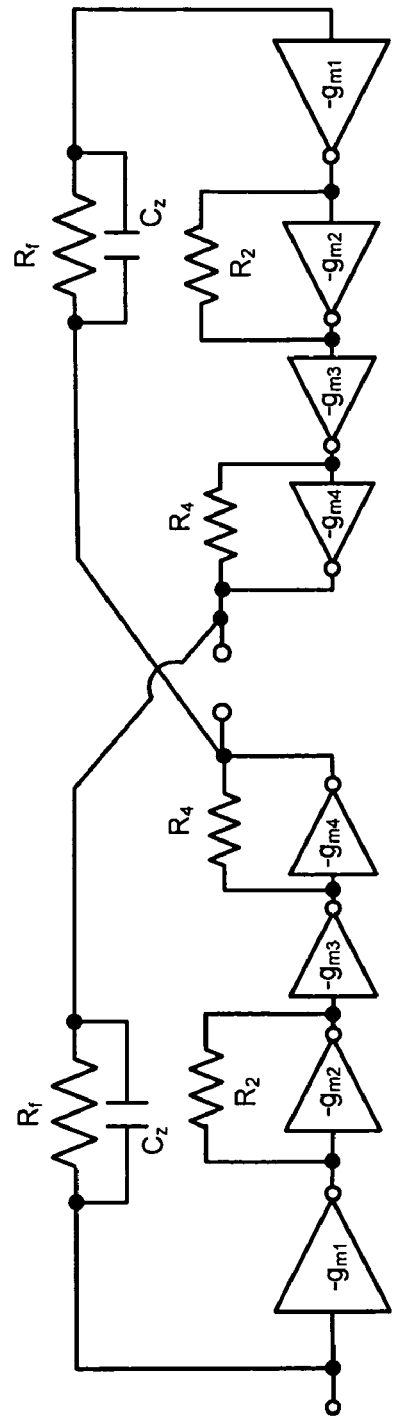
FIG. 16 is an electrical schematic of a differential circuit implementation using the circuit of FIG. 14.

Referring now to FIGS. 15 and 16, the open loop response of the circuit of FIG. 14 is illustrated using the open loop response technique. Note that three nondominant poles occur at very high frequencies due to fact that the parasitic capacitances $C_3$, $C_4$, and $C_5$ have a relatively low value. The lowest nondominant pole also occurs at a relatively high frequency since the resistance $R_2$ has a relatively low value. As for the crossover frequency, note that the transconductance $g_{m1}$ is fixed for noise purposes, the feedback resistance $R_f$ is fixed by the input impedance $R_{in}$, capacitor $C_1$ is fixed, and the resistance $R_2$ is set low for bandwidth purposes. However, transconductances $g_{m3}$ and $g_{m4}$ can be adjusted to further increase bandwidth. Thus, the circuit of FIG. 14 provides even greater flexibility in achieving a high gain, high bandwidth amplifier with other desirable circuit characteristics. In FIG. 16, a differential embodiment of the circuit of FIG. 14 is illustrated. Note that the parasitic capacitances have been omitted in FIG. 16.

Figure 17:
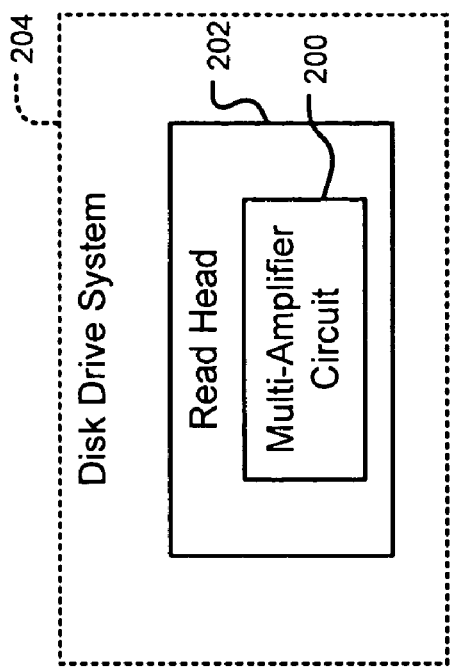
FIG. 17 is a functional block diagram of the multiple amplifier circuit according to the present invention that is implemented in a read head of a disk drive system.
Figure 18:
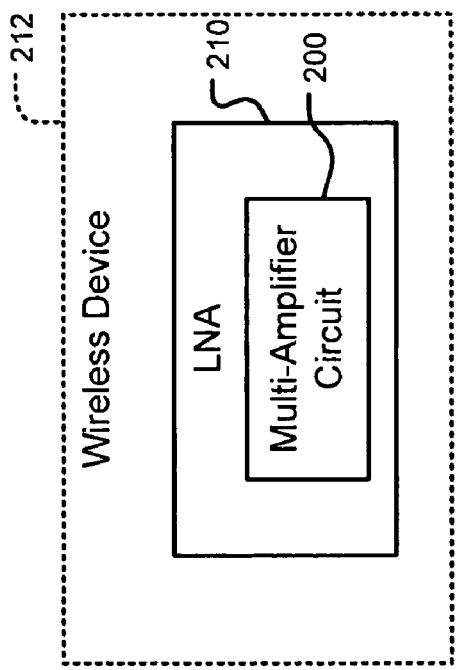
FIG. 18 is a functional block diagram of the multiple amplifier circuit according to the present invention that is implemented in a low noise amplifier (LNA) of a wireless device.

Referring now to FIGS. 17 and 18, several exemplary implementations of the multiple amplifier circuit 200 are shown. The multiple amplifier circuit 200 may be any of the multiple amplifier circuits shown in FIGS. 8-16. In FIG. 17, the multiple amplifier circuit 200 according to the present invention is implemented in a read head 202 of a disk drive system 204. In FIG. 18, the multiple amplifier circuit 200 is implemented in a low noise amplifier (LNA) 210 of a wireless device 212. For example, the wireless device 212 may be compliant with Bluetooth networks, cellular networks, and/or Ethernet networks such as 802.11a, 802.11b, 802.11n, 802.11g, 802.16 and/or other present and future wireless standards.

Figure 19:
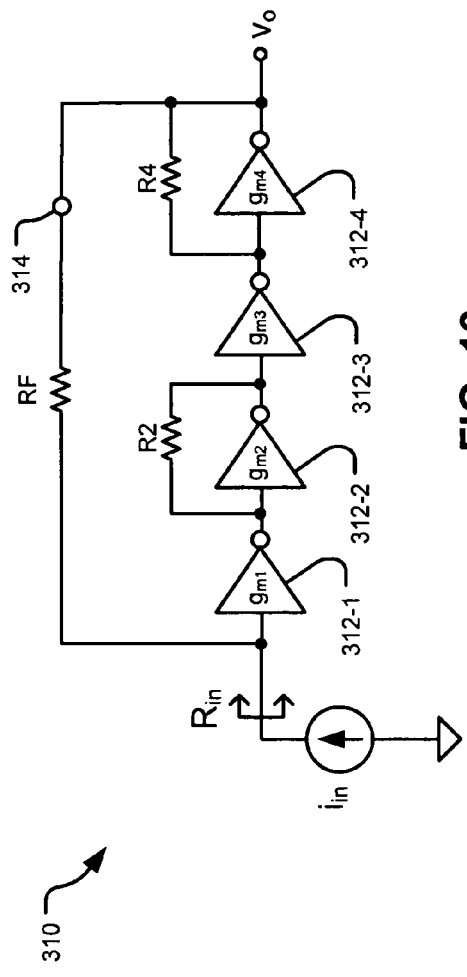
FIG. 19 is a schematic diagram of a multistage transimpedance amplifier TIA according to another embodiment of the present invention.

Referring now to FIG. 19, another embodiment of a single-ended multistage transimpedance amplifier (TIA) 310 is shown. Multistage TIA 310 includes first through fourth inverting transconductance amplifiers 312-1, . . . , 312-4, however any number of transconductance amplifiers 312 can be used. Transconductance amplifiers 312 are connected in series and each has a respective transconductance gain of $g_{mn}$, where n is the sequence number of the associated transconductance amplifier 312-n. Second transconductance amplifier 312-2 includes a feedback resistor R2 that connects between the output and the input of second transconductance amplifier 312-2. Fourth transconductance amplifier 312-4 includes a feedback resistor R4 that connects between the output and the input of fourth transconductance amplifier 312-4. A third feedback resistor RF establishes the overall gain G and connects between the output of fourth transconductance amplifier 312-4 and the input of first transconductance amplifier 312-1. An inverter 314 connects in series with feedback resistor RF when even numbers of inverting transconductance amplifiers 312 are used. The input current signal $i_{in}$ is applied to the input of first transconductance amplifier 312-1. The output voltage $v_o$ is taken at the output of fourth transconductance amplifier 312-4.

Multistage TIA 310 has an input resistance $R_{in}$ that is approximated by the equation $$R_{in} = RF/(1 + g_{m1}R2 + g_{m3}R4). \tag{Eq. 1}$$

The overall gain G is approximated by the equation $$G = RF. \tag{Eq. 2}$$

From Eq. 2 it can be seen that the overall gain G can be increased by increasing the resistance of RF. However, Eq. 1 shows that increasing the resistance of RF also increases the input resistance $R_{in}$. One or more of the terms in the denominator of Eq. 1, such as R2 and/or R4, must also be increased in order to increase the overall gain G while keeping the input resistance $R_{in}$ constant. However, there is a practical upper limit on R2 and/or R4.

Figure 20:
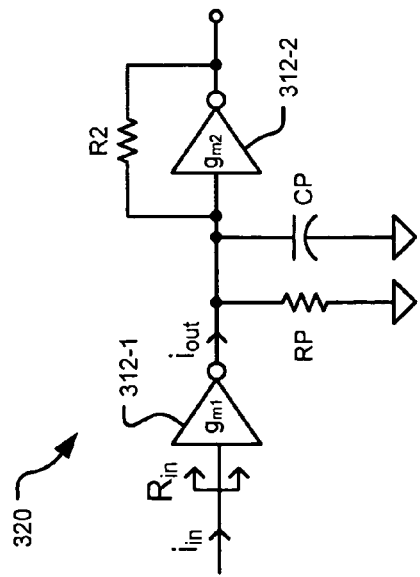
FIG. 20 is a schematic diagram that models a portion of the TIA of FIG. 19.

Referring now to FIG. 20, a second-approximation model 320 shows transconductance amplifiers 312-1 and 312-2 of FIG. 19. Model 320 uses transconductance amplifiers 312-1 and 312-2 to demonstrate the practical upper limit on R2, however it should be appreciated that model 320 also applies to transconductance amplifiers 312-3 and 312-4 and the practical upper limit on R4.

Model 320 includes a resistor RP and a parasitic capacitor CP that connect between the output of transconductance amplifier 312-1 and ground. The resistance of resistor RP can be approximated by the equation $$RP = 20/g_{m1}. \tag{Eq. 3}$$

If the effects of resistor RP and capacitor CP are ignored, the overall gain of model 320 can be approximated by the equation $$G = g_{m1}R2. \tag{Eq. 4}$$

When the effects of resistor RP and capacitor CP are considered, the overall gain can be substantially lower than the approximation provided by Eq. 4.

The operation of model 320 will now be described. The input current $i_{in}$ includes a magnitude and a frequency. The output of transconductance amplifier 312-1 generates an output voltage and corresponding output current $i_{out}$. The output current $i_{out}$ splits into a first circuit branch that includes resistor R2, a second circuit branch that includes the resistor RP, and a third circuit branch that includes capacitor CP. The current flowing though resistor R2 generates the voltage at the output of second transconductance amplifier 312-2 and therefore also establishes the overall gain of model 320. As the resistance of resistor R2 increases, a larger fraction of the output current $i_{out}$ flows through resistor RP. This causes the overall gain of model 320 to decrease since less current is flowing through resistor R2. Also, as the frequency of the output current $i_{out}$ increases, the current flow through capacitor CP also increases. This causes the current through resistor R2, and the overall gain, to decrease as the frequency of the output current $i_{out}$ increases.

Figure 21:
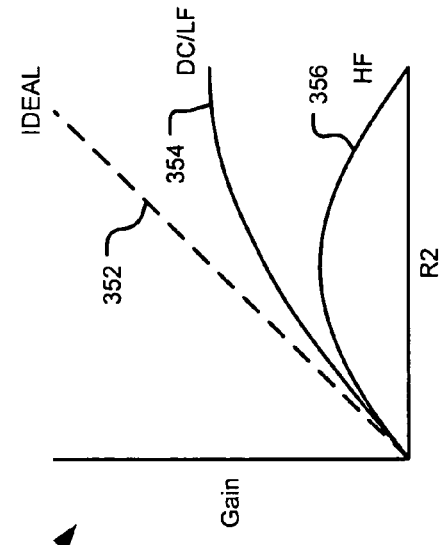
FIG. 21 is a plot of the overall gain of the TIA of FIG. 19 under various assumptions.

Referring now to FIG. 21, an unscaled graph 350 shows approximated overall gains of model 320 as a function of the resistance of R2. A dashed line 352 represents the approximations provided by Eq. 4. Since Eq. 4 ignores the effects of resistor RP and capacitor CP, dashed line 352 is straight because Eq. 4 is primarily dependent on the resistance of resistor R2 ($g_{mn}$ is generally constant for a given transconductance amplifier 312-n).

Curved lines 354 and 356 show approximated oval gains when the effects of resistor RP and capacitor CP are considered. Curved line 354 shows the gain at low frequencies and DC, wherein the effects of resistor RP swamp out the effects of capacitor CP. Line 354 shows that the gain increases with resistor R2 and then levels off as the increase in current flow through resistor RP swamps out the increase in current flow through resistor R2. Curved line 356 shows the gain at high frequencies where the effects of capacitor CP and resistor RP are significant. Line 356 shows the gain initially increasing with resistor R2. The gain in line 356 decreases as the resistance of resistor R2 increasingly exceeds the equivalent impedance presented by the parallel combination resistor RP and capacitor CP. The vertical distances between line 352 and lines 354 and/or 356 indicate the errors introduced by Eq. 4 and additional challenges in choosing resistor values for the feedback network in a multiple stage TIA.

Figure 22:
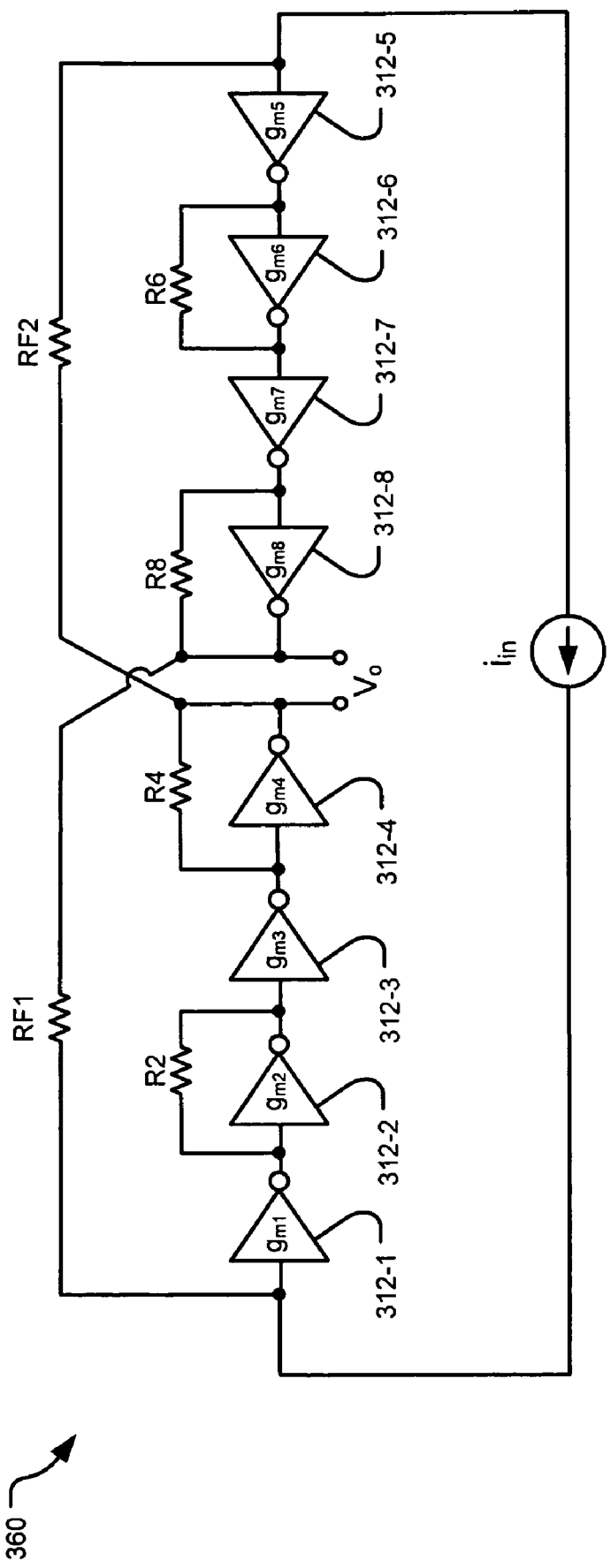
FIG. 22 is a differential multistage TIA according to another embodiment of the present invention.

Referring now to FIG. 22, a differential multistage TIA 360 is shown that is based on the single-ended multistage TIA 310 of FIG. 19. TIA 360 includes transconductance amplifiers 312-1, . . . , 312-4 and resistors R2, R4, which are connected as shown in FIG. 19. Fifth through eighth transconductance amplifiers 312-5, . . . , 312-8 are connected in series. Sixth transconductance amplifier 312-6 is associated with a feedback resistor R6 that connects between the output and the input of sixth transconductance amplifier 312-6. Eighth transconductance amplifier 312-8 is associated with a feedback resistor R8 that connects between the output and the input of eighth transconductance amplifier 312-8.

A feedback resistor RF1 connects between the output of eighth transconductance amplifier 312-8 and the input of first transconductance amplifier 312-1. A feedback resistor RF2 connects between the output of fourth transconductance amplifier 312-4 and the input of fifth transconductance amplifier 312-5. The differential input current $i_{in}$ is applied to the inputs of the first and fifth transconductance amplifiers 312-1 and 312-5. The output voltage $v_o$ is take across the outputs of the fourth and eighth transconductance amplifiers 312-4 and 312-8. Differential mode TIA 360 exhibits the properties shown in FIGS. 20-21 and therefore can be as challenging to implement as single-ended multistage TIA 310 of FIG. 19.

Figure 23:
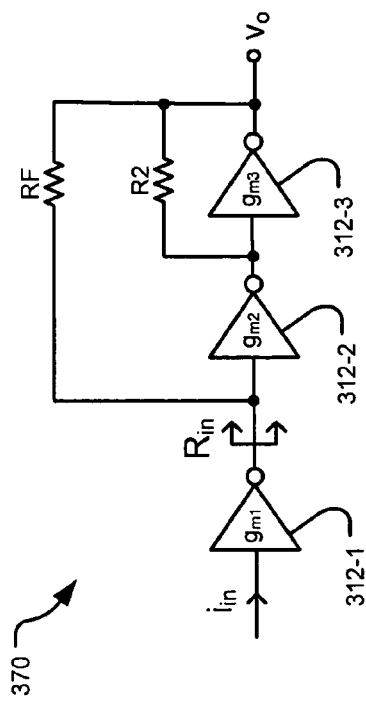
FIG. 23 is a schematic diagram of a multistage TIA that includes a feedback architecture according to another embodiment of the present invention.

Referring now to FIG. 23, a multistage TIA 370 is shown that includes an improved feedback architecture. TIA 370 includes three transconductance amplifiers 312-1, 312-2, and 312-3, wherein transconductance amplifiers 312-2 and 312-3 employ the improved architecture. While FIG. 23 shows two transconductance amplifiers 312 that employ the improved architecture, it should be appreciated that the architecture is extendible to a greater number of transconductance amplifiers 312.

The transconductance amplifiers 312 that employ the improved feedback architecture, e.g. transconductance amplifiers 312-2 and 312-3, are connected in series. The output of the final transconductance amplifier 312 in the series, e.g. transconductance amplifier 312-3, is fed back to the input of each transconductance amplifier 312 through a respective feedback resistor. The overall gain for the transconductance amplifiers 312 that employ the improved architecture can be approximated by Eq. 2.

The improved architecture provides an input impedance $R_{in}$ that can be approximated by the equation $$R_{in} = RF/g_{m2}R2. \qquad (\text{Eq. 5})$$

It can be seen from Eqs 2 and 5 that the overall gain G can be varied by changing RF while simultaneously varying R2 to keep the input impedance $R_{in}$ approximately constant. In some embodiments the transconductance amplifiers 312-n are arranged such that their respective transconductance gains $g_{mn}$ decrease as n increases.

Figure 24:
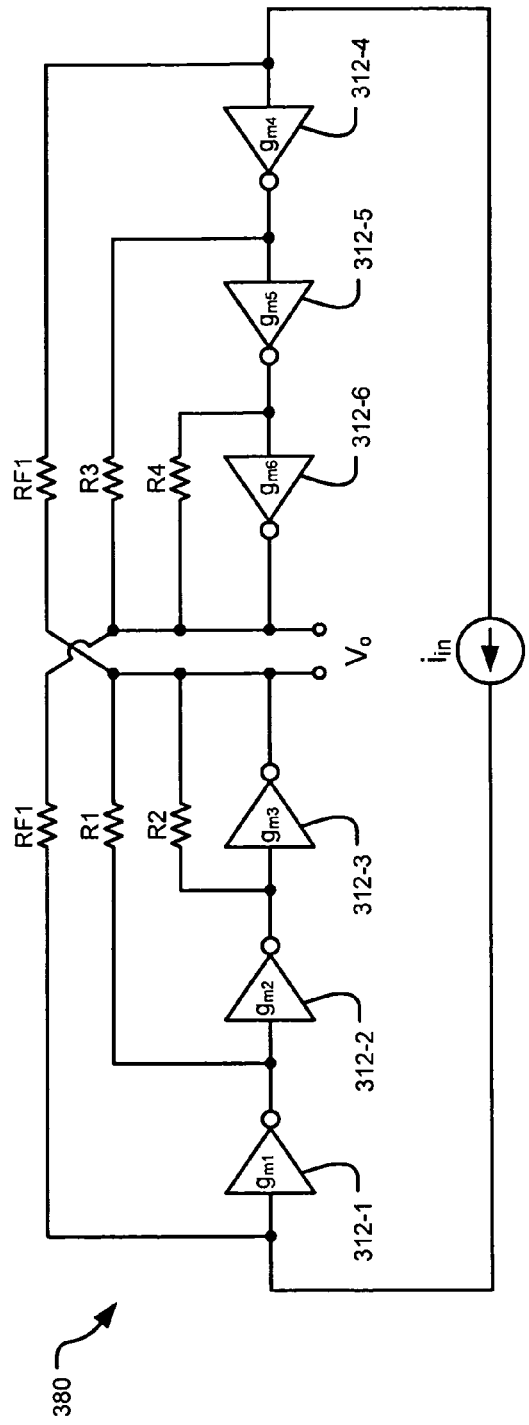
FIG. 24 is a schematic diagram of a differential multistage TIA that employs the feedback architecture of FIG. 23.

Referring now to FIG. 24, the improved feedback architecture is employed in a first differential multistage TIA 380. In general, differential multistage TIAs include two portions that each include a plurality of transconductance amplifiers 312. The feedback networks of the portions generally are constructed according to the same architecture. Also, the transconductance gain of each transconductance amplifier is approximately equal to the transconductance gain of the corresponding transconductance amplifier in the opposite portion.

A first portion of TIA 380 includes four transconductance amplifiers 312-1, . . . , 312-4 that are connected in series. A second portion of TIA 380 includes four transconductance amplifiers 312-5, . . . , 312-8 that are connected in series. Transconductance amplifiers 312-3 and 312-4 employ respective resistors R1 and R2 to implement the improved feedback architecture. Similarly, transconductance amplifiers 312-7 and 312-8 employ respective resistors R3 and R4 to implement the improved feedback architecture. TIA 380 also includes a first feedback resistor RF1 that connects between the output of transconductance amplifier 312-8 and the input of transconductance amplifier 312-2. A second feedback resistor RF2 connects between the output of transconductance amplifier 312-4 and the input of transconductance amplifier 312-6.

Referring now to FIG. 25, an embodiment of a TIA 382 is shown. TIA 382 is similar to TIA 380 except resistors R1-R4, RF1 and RF2 are implemented as variable resistors. The variable resistors can be digitally controlled and used to vary the overall gain of TIA 382.

Referring now to FIG. 26, an embodiment of a TIA 384 is shown. TIA 384 is similar to TIA 380 except the transconductance amplifiers 312 are of different sizes or widths W. First TIA 312-1 is larger than second transconductance amplifier 312-2, and second transconductance amplifier 312-2 is larger than third transconductance amplifier 312-3. Transconductance amplifiers 312-4, . . . , 312-6 are generally the same size as corresponding counterpart transconductance amplifiers 312-1, . . . , 312-3.

Figure 27:
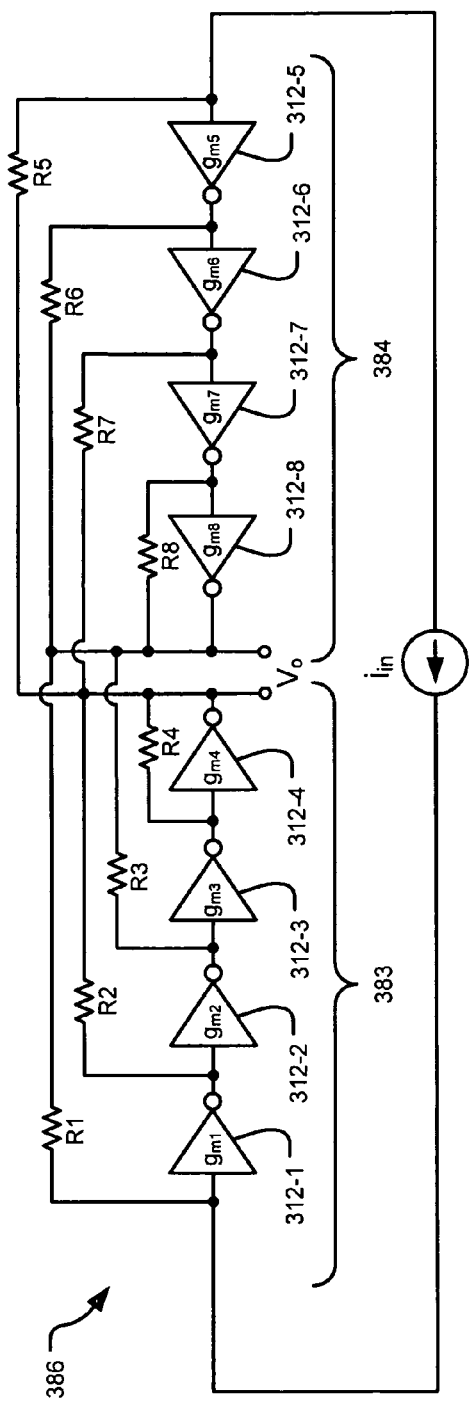
FIG. 27 is a schematic diagram of another differential multistage TIA according to the present invention.

Referring now to FIG. 27, another embodiment of a differential multistage TIA 386 is shown that employs the improved feedback architecture. A first portion 383 of TIA 382 includes four transconductance amplifiers 312-1, . . . , 312-4 that are connected in series, with the output of first portion 383 being taken at the output of transconductance amplifier 312-4. A second portion 384 of TIA 380 includes four transconductance amplifiers 312-5, . . . , 312-8 that are connected in series, with the output of second portion 384 being taken at the output of transconductance amplifier 312-8. The output voltage $v_o$ is taken across the outputs of the first and second portions 383 and 384. The input current $i_{in}$ is applied to the input of the first transconductance amplifier in each portion, e.g transconductance amplifier 312-1 for first portion 383 and transconductance amplifier 312-5 for second portion 384. While TIA 382 is depicted with four transconductance amplifiers 312 in each portion, it should be appreciated that TIA 382 can be implemented with three or more transconductance amplifiers 312 in each portion.

In first portion 383, transconductance amplifiers 312-2 and 312-4 employ the improved feedback architecture via resistors R2 and R4, respectively. Transconductance amplifier 312-3 includes an input that connects to the output of transconductance amplifier 312-2 and an output that connects to the input of transconductance amplifier 312-4. A feedback resistor R3 connects between the output of second portion 384 and the input of transconductance amplifier 312-3. Transconductance amplifier 312-1 includes an input that receives the input current $i_{in}$ and an output that connects to the input of transconductance amplifier 312-2. A feedback resistor R1 connects between the output of second portion 384 and the input of transconductance amplifier 312-1.

In second portion 384, transconductance amplifiers 312-6 and 312-8 employ the improved feedback architecture via resistors R6 and R8, respectively. Transconductance amplifier 312-7 includes an input that connects to the output of transconductance amplifier 312-6 and an output that connects to the input of transconductance amplifier 312-8. A feedback resistor R7 connects between the output of first portion 383 and the input of transconductance amplifier 312-7. Transconductance amplifier 312-5 includes an input that receives the input current $i_{in}$ and an output that connects to the input of transconductance amplifier 312-6. A feedback resistor R5 connects between the output of first portion 383 and the input of transconductance amplifier 312-5.

Figure 28:
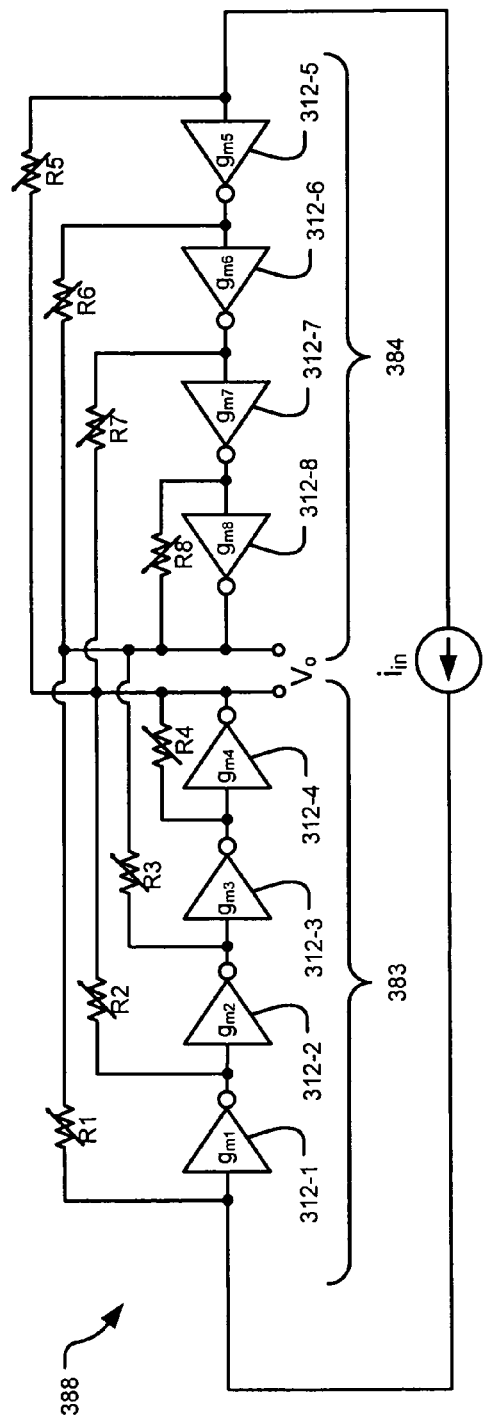
FIG. 28 is a schematic diagram of the differential multistage TIA of FIG. 27 that employs variable resistances.

Referring now to FIG. 28, an embodiment of a TIA 388 is shown. TIA 388 is similar to TIA 386 except the resistors R1-R8 are implemented as variable resistors. The variable resistors can be digitally controlled and used to vary the overall gain of TIA 400.

Referring now to FIG. 29, an embodiment of a TIA 390 is shown. TIA 390 is similar to TIA 386 except the transconductance amplifiers 312 are of different sizes or widths W. First TIA 312-1 is larger than second transconductance amplifier 312-2, second transconductance amplifier 312-2 is larger than third transconductance amplifier 312-3, and third transconductance amplifier 312-3 is larger than fourth transconductance amplifier 312-4. Transconductance amplifiers 312-5, . . . , 312-8 are generally the same size as corresponding counterpart transconductance amplifiers 312-1, . . . , 312-4.

Referring now to FIG. 30 a graph 392 shows the overall gain of TIA 386 as a function of frequency. A line 394 shows that the overall gain G is approximately flat.

Referring now to FIG. 31, a graph 396 shows the overall phase shift of TIA 386 as a function of frequency. A line 398 shows that the overall phase shift is approximately flat.

Figure 32B:
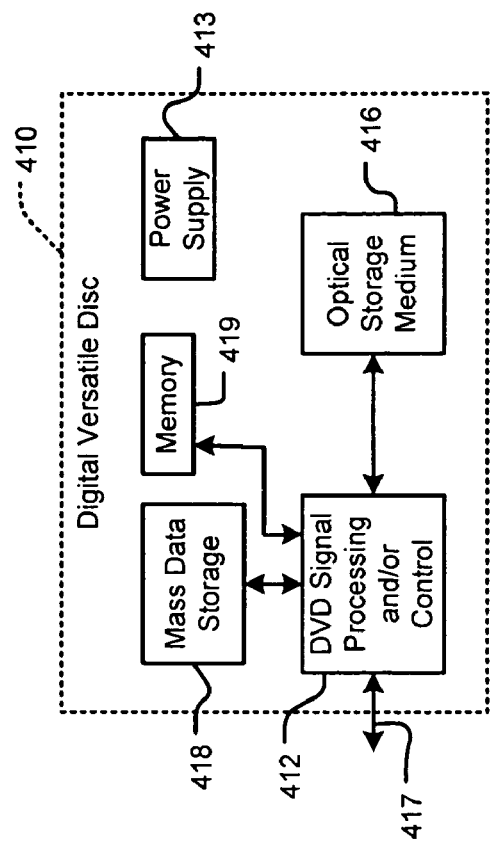
FIG. 32B is a functional block diagram of a digital versatile disk (DVD)
Figure 32A:
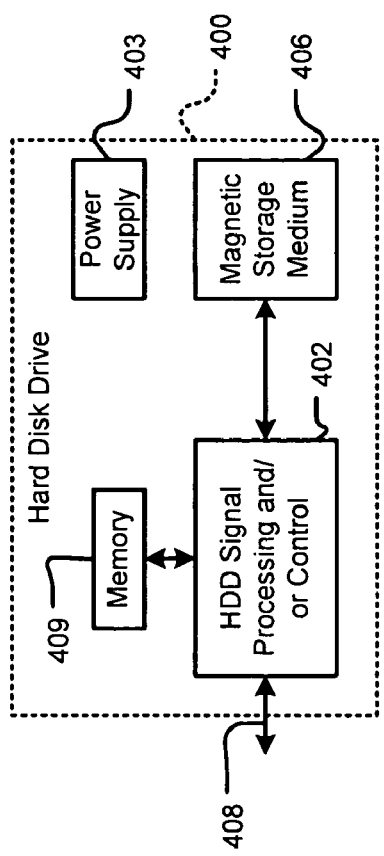
FIG. 32A is a functional block diagram of a hard disk drive.

Referring now to FIGS. 32A-32G, various exemplary implementations of the present invention are shown. Referring now to FIG. 32A, the present invention can be implemented in amplifiers of a hard disk drive 400. The present invention may implement and/or be implemented in either or both signal processing and/or control circuits which are generally identified in FIG. 32A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage. The HD 400 may also include a power supply 403.

Referring now to FIG. 32B, the present invention can be implemented in amplifiers of a digital versatile disc (DVD) drive 410. The present invention may implement and/or be implemented in either or both signal processing and/or control circuits, which are generally identified in FIG. 32B at 412. The signal processing and/or control circuit 412 and/or other circuits (not shown) in the DVD drive 410 may process data, perform coding and/or encryption, perform calculations, and/or format data that is read from and/or data written to an optical storage medium 416. In some implementations, the signal processing and/or control circuit 412 and/or other circuits (not shown) in the DVD drive 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD drive 410 may communicate with mass data storage 418 that stores data in a nonvolatile manner. The mass data storage 418 may include a hard disk drive (HDD). The HDD may have the configuration shown in FIG. 32A. The HDD may be a mini HDD that includes one or more platters having a diameter that is smaller than approximately 1.8". The DVD drive 410 may be connected to memory 419 such as RAM, ROM, low latency nonvolatile memory such as flash memory and/or other suitable electronic data storage. The DVD drive 410 also may include a power supply 413.

Figures 32C, 32D:
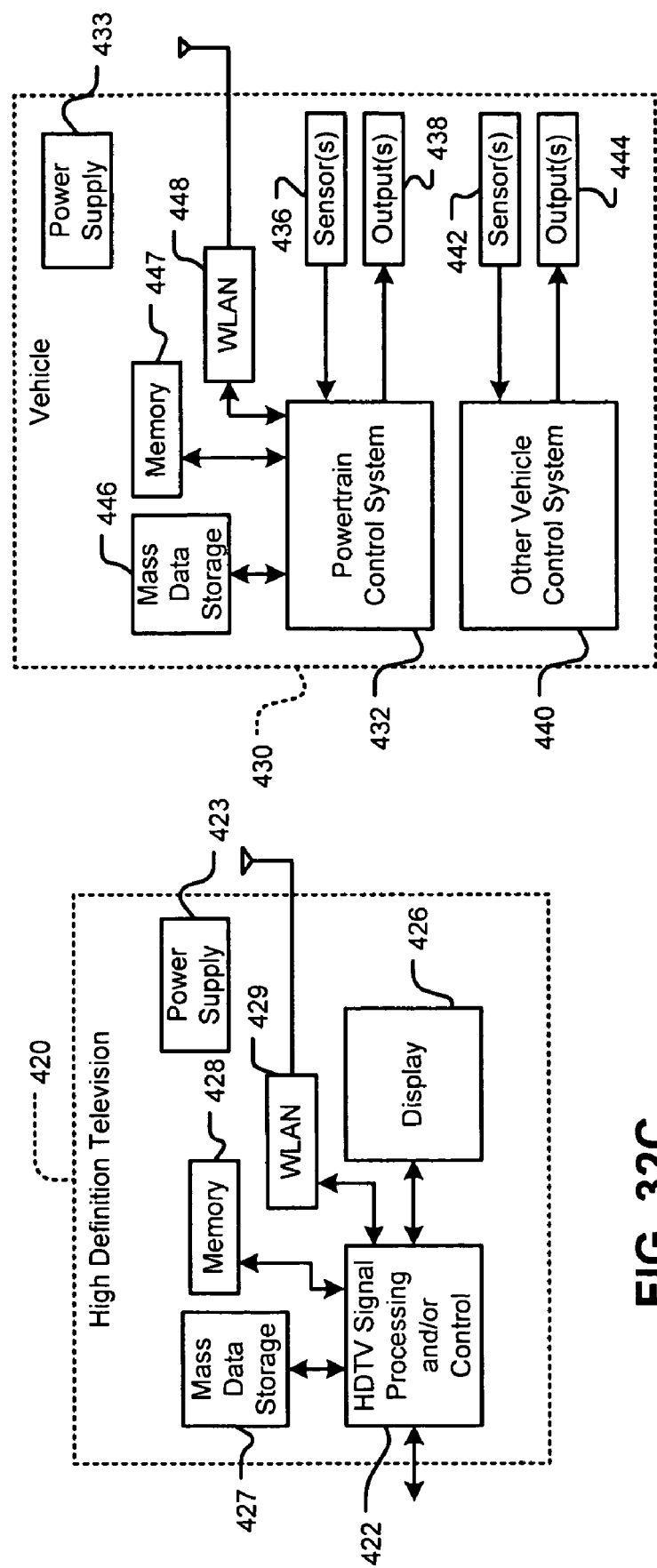
FIG. 32C is a functional block diagram of a high definition television.
FIG. 32D is a functional block diagram of a vehicle control system.

Referring now to FIG. 32C, the present invention can be implemented in amplifiers of a high definition television (HDTV) 420. The present invention may implement and/or be implemented in either or both signal processing and/or control circuits, which are generally identified in FIG. 32E at 422. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 32A and/or at least one DVD may have the configuration shown in FIG. 32B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429. The HDTV 420 also may include a power supply 423.

Referring now to FIG. 32D, the present invention may implement and/or be implemented in amplifiers of a control system of a vehicle 430. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 32A and/or at least one DVD may have the configuration shown in FIG. 32B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown). The vehicle 430 also may include a power supply 433.

Referring now to FIG. 32E, the present invention can be implemented in amplifiers of a cellular phone 450 that may include a cellular antenna 451. The present invention may implement and/or be implemented in either or both signal processing and/or control circuits, which are generally identified in FIG. 32E at 452. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 32A and/or at least one DVD may have the configuration shown in FIG. 32B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468. The cellular phone 450 also may include a power supply 453.

Referring now to FIG. 32F, the present invention can be implemented in amplifiers of a set top box 480. The present invention may implement and/or be implemented in either or both signal processing and/or control circuits, which are generally identified in FIG. 32F at 484. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 32A and/or at least one DVD may have the configuration shown in FIG. 32B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496. The set top box 480 also may include a power supply 483.

Figure 32G:
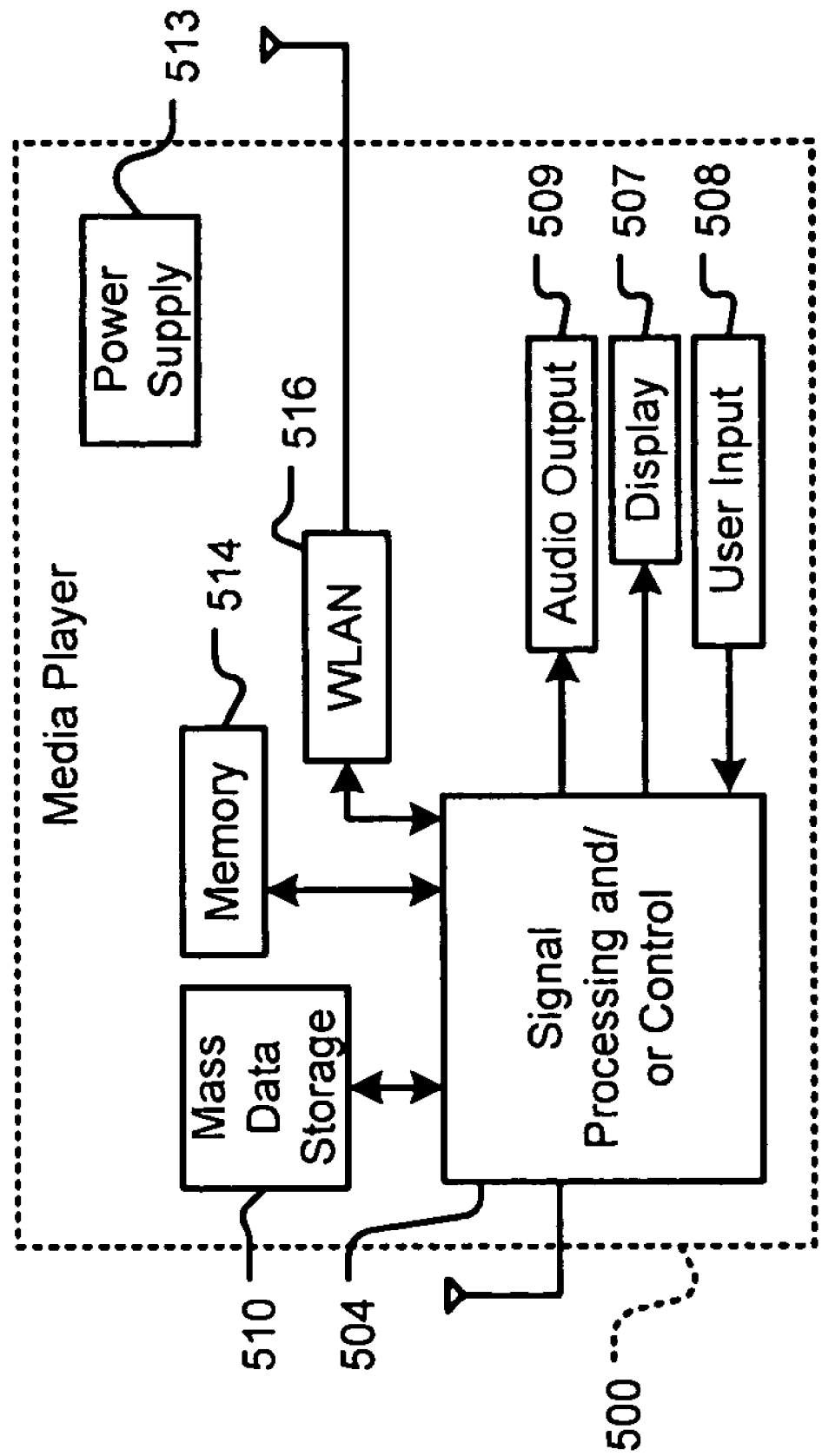
FIG. 32G is a functional block diagram of a media player.

Referring now to FIG. 32G, the present invention can be implemented in amplifiers of a media player 500. The present invention may implement and/or be implemented in either or both signal processing and/or control circuits, which are generally identified in FIG. 32G at 504. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 32A and/or at least one DVD may have the configuration shown in FIG. 32B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. The media player 500 also may include a power supply 513. Still other implementations in addition to those described above are contemplated.

Skilled artisans will appreciate that there are a wide variety of other applications for the multiple amplifier circuit according to the present invention. As can be appreciated, the resistance and capacitances can be implemented in a wide variety of ways including but not limited to discrete elements such as resistors and capacitors, nonlinear variable resistors and capacitors, and/or transistor-based resistances and capacitances. Still other variations are contemplated.

Those skilled in the art can now appreciate from the foregoing description that the broad teachings of the present invention can be implemented in a variety of forms. For example, the present invention can be applied to a wide variety of applications including, for example, CMOS readers. Therefore, while this invention has been described in connection with particular examples thereof, the true scope of the invention should not be so limited since other modifications will become apparent to the skilled practitioner upon a study of the drawings, specification, and the following claims.

What is claimed is:

1. A transimpedance amplifier (TIA) comprising:
N cascaded pairs of transconductance amplifiers, where N is an integer greater than 1, and wherein each one of said N cascaded pairs includes:
a first transconductance amplifier having an input and an output;
a second transconductance amplifier having an input and an output, wherein said input of said second transconductance amplifier communicates with said output of said first transconductance amplifier; and
a first resistance having first and second ends that communicate with said input and said output of said second transconductance amplifier, respectively; and
a second resistance having
a first end that communicates with said input of said first transconductance amplifier of a first one of said N cascaded pairs, and
a second end that communicates with said output of said second transconductance amplifier of a last one of said N cascaded pairs.

2. The TIA of claim 1 wherein said input of said first transconductance amplifier of said first one of said N cascaded pairs receives an input signal, and wherein an output of said TIA is generated at said output of said second transconductance amplifier of said last one of said N cascaded pairs.

3. The TIA of claim 1 further comprising an inverter having:
a first end that communicates with said second end of said second resistance, and
a second end that communicates with said output of said second transconductance amplifier of said last one of said N cascaded pairs.

4. The TIA of claim 1 wherein said each one of said N cascaded pairs further comprises a third resistance and a capacitance that communicate in parallel with said output of said first transconductance amplifier.

5. A transimpedance amplifier (TIA) comprising:
a first set of N cascaded pairs of transconductance amplifiers and a second set of N cascaded pairs of transconductance amplifiers, where N is an integer greater than 1, and wherein each one of said first set of N cascaded pairs and each one of said second set of N cascaded pairs includes:
a first transconductance amplifier having an input and an output;
a second transconductance amplifier having an input and an output, wherein said input of said second transconductance amplifier communicates with said output of said first transconductance amplifier; and
a first resistance having first and second ends that communicate with said input and said output of said second transconductance amplifier, respectively;
a second resistance having
a first end that communicates with said input of said first transconductance amplifier of a first one of said first set of N cascaded pairs, and
a second end that communicates with said output of said second transconductance amplifier of a last one of said second set of N cascaded pairs; and
a third resistance having
a first end that communicates with said input of said first transconductance amplifier of a first one of said second set of N cascaded pairs, and
a second end that communicates with said output of said second transconductance amplifier of a last one of said first set of N cascaded pairs.

6. The TIA of claim 5 wherein:
said input of said first transconductance amplifier of said first one of said first set of N cascaded pairs and said input of said first transconductance amplifier of said first one of said second set of N cascaded pairs receive an input signal; and
an output of said TIA is generated across said output of said second transconductance amplifier of said last one of said first set of N cascaded pairs and said output of said second transconductance amplifier of said last one of said second set of N cascaded pairs.

7. The TIA of claim 5 further comprising:
a first inverting transconductance amplifier having a first end that communicates with said second end of said second resistance, and a second end that communicates with said output of said second transconductance amplifier of said last one of said second set of N cascaded pairs; and
a second inverting transconductance amplifier having a first end that communicates with said second end of said third resistance, and a second end that communicates with said output of said second transconductance amplifier of said last one of said first set of N cascaded pairs.

8. The TIA of claim 5 wherein each one of said first set of N cascaded pairs and each one of said second set of N cascaded pairs further comprise a fourth resistance and a capacitance that communicate in parallel with said output of said first transconductance amplifier.

9. A transimpedance amplifier (TIA) comprising:
N transconductance amplifiers, wherein an output of an $i^{th}$ one of said N transconductance amplifiers communicates with an input of an $(i+1)^{th}$ one of said transconductance amplifiers, where N is an integer greater than 2, and $1 \leq i \leq (N-1)$; and
(N−1) resistances each having first and second ends, wherein said first ends of said (N−1) resistances communicate with an output of a last one of said N transconductance amplifiers, and wherein said second ends of said (N−1) resistances communicate with inputs of second through $N^{th}$ ones of said N transconductance amplifiers, respectively.

10. The TIA of claim 9 wherein an input of a first one of said N transconductance amplifiers receives an input signal, and wherein an output of said TIA is generated at said output of said last one of said N transconductance amplifiers.

11. The TIA of claim 9 wherein said N transconductance amplifiers have N transconductance gains, respectively, and wherein said N transconductance gains decrease as N increases.

12. A transimpedance amplifier (TIA) comprising:
a first set of N transconductance amplifiers, wherein an output of an $i^{th}$ one of said first set of N transconductance amplifiers communicates with an input of an $(i+1)^{th}$ one of said first set of N transconductance amplifiers, where N is an integer greater than 2, and $1 \leq i \leq (N-1)$;
a second set of N transconductance amplifiers, wherein an output of an $i^{th}$ one of said second set of N transconductance amplifiers communicates with an input of an $(i+1)^{th}$ one of said second set of N transconductance amplifiers;

(N−1) first resistances each having first ends that communicate with an output of a last one of said first set of N transconductance amplifiers, and second ends that communicate with inputs of second through $N^{th}$ ones of said first set of N transconductance amplifiers, respectively;

(N−1) second resistances each having first ends that communicate with an output of a last one of said second set of N transconductance amplifiers, and second ends that communicate with inputs of second through $N^{th}$ ones of said second set of N transconductance amplifiers, respectively;

a first feedback resistance having a first end that communicates with an input of a first one of said first set of N transconductance amplifiers, and a second end that communicates with said output of said last one of said second set of N transconductance amplifiers; and a second feedback resistance having a first end that communicates with an input of a first one of said second set of N transconductance amplifiers, and a second end that communicates with said output of said last one of said first set of N transconductance amplifiers.

13. The TIA of claim 12 wherein:
said input of said first one of said first set of N transconductance amplifiers and said input of said first one of said second set of N transconductance amplifiers receive an input signal; and
an output of said TIA is generated across said output of said last one of said first set of N transconductance amplifiers and said output of said last one of said second set of N transconductance amplifiers.

14. The TIA of claim 12 wherein:
said first set of N transconductance amplifiers have N transconductance gains, respectively;
said second set of N transconductance amplifiers have said N transconductance gains, respectively; and
said N transconductance gains decrease as N increases.

15. The TIA of claim 12 wherein said (N−1) first resistances, said (N−1) second resistances, and said first and second feedback resistances include variable resistances.

16. The TIA of claim 12 wherein:
said first set of N transconductance amplifiers have N widths, respectively;
said second set of N transconductance amplifiers have said N widths, respectively; and
said N widths decrease as N increases.

17. A transimpedance amplifier (TIA) comprising:
a first set of N transconductance amplifiers, wherein an output of an $i^{th}$ one of said first set of N transconductance amplifiers communicates with an input of an $(i+1)^{th}$ one of said first set of N transconductance amplifiers, where N is an integer greater than 2, and $1 \leq i \leq (N-1)$;

a second set of N transconductance amplifiers, wherein an output of an $i^{th}$ one of said second set of N transconductance amplifiers communicates with an input of an $(i+1)^{th}$ one of said second set of N transconductance amplifiers;

a first set of N resistances each having first ends that communicate with inputs of said first set of N transconductance amplifiers, respectively, and second ends; and a second set of N resistances each having first ends that communicate with inputs of said second set of N transconductance amplifiers, respectively, and second ends, wherein said second ends of one half of said first set of N resistances communicate with an output of a last one of said first set of N transconductance amplifiers, wherein said second ends of another half of said first set of N resistances communicate with an output of a last one of said second set of N transconductance amplifiers, wherein said second ends of one half of said second set of N resistances communicate with said output of said last one of said second set of N transconductance amplifiers, and wherein said second ends of another half of said second set of N resistances communicate with said output of said last one of said first set of N transconductance amplifiers.

18. The TIA of claim 17 wherein:
an input of a first one of said first set of N transconductance amplifiers and an input of a first one of said second set of N transconductance amplifiers receive an input signal; and
an output of said TIA is generated across said output of said last one of said first set of N transconductance amplifiers and said output of said last one of said second set of N transconductance amplifiers.

19. The TIA of claim 17 wherein:
said first set of N transconductance amplifiers have N transconductance gains, respectively;
said second set of N transconductance amplifiers have said N transconductance gains, respectively; and
said N transconductance gains decrease as N increases.

20. The TIA of claim 17 wherein said first and second sets of N resistances include variable resistances.

21. The TIA of claim 20 wherein:
said first set of N transconductance amplifiers have N widths, respectively;
said second set of N transconductance amplifiers have said N widths, respectively; and
said N widths decrease as N increases.

* * * * *